US010559728B2

(12) United States Patent
Ho et al.

(10) Patent No.: US 10,559,728 B2
(45) Date of Patent: Feb. 11, 2020

(54) SEMICONDUCTOR PACKAGE STRUCTURE

(71) Applicant: Everlight Electronics Co., Ltd., New Taipei (TW)

(72) Inventors: Chih-Ming Ho, New Taipei (TW); Chun-Chih Liang, New Taipei (TW); Ding-Hwa Cherng, New Taipei (TW); Kuang-Mao Lu, New Taipei (TW); Wen-Chueh Lo, New Taipei (TW); Hao-Yu Yang, New Taipei (TW); Chieh-Yu Kang, New Taipei (TW); Han-Chang Pan, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/113,116

(22) Filed: Aug. 27, 2018

(65) Prior Publication Data

US 2019/0259924 A1 Aug. 22, 2019

Related U.S. Application Data

(60) Provisional application No. 62/550,694, filed on Aug. 27, 2017, provisional application No. 62/613,056, (Continued)

(51) Int. Cl.
| | |
|---|---|
| *H01L 33/54* | (2010.01) |
| *H01L 33/48* | (2010.01) |
| *H05K 1/18* | (2006.01) |
| *H01L 31/02* | (2006.01) |
| *H01L 31/0203* | (2014.01) |

(Continued)

(52) U.S. Cl.
CPC .......... *H01L 33/54* (2013.01); *H01L 31/0203* (2013.01); *H01L 31/02005* (2013.01); *H01L 33/486* (2013.01); *H01L 33/56* (2013.01); *H01L 33/62* (2013.01); *H01S 5/02236* (2013.01); *H05K 1/184* (2013.01); *H01L 24/48* (2013.01); *H01L 2224/48091* (2013.01); *H01L 2224/48227* (2013.01); *H01L 2224/48464* (2013.01); *H01L 2924/00014* (2013.01); *H01L 2924/12041* (2013.01); *H01L 2924/12043* (2013.01); *H01L 2924/181* (2013.01); *H05K 1/111* (2013.01); *H05K 3/34* (2013.01); *H05K 2201/09063* (2013.01)

(58) Field of Classification Search
None
See application file for complete search history.

(56) References Cited

U.S. PATENT DOCUMENTS

2016/0027979 A1  1/2016  Haushalter et al.

FOREIGN PATENT DOCUMENTS

| CN | 104164209 A | 11/2014 |
| CN | 105164826 A | 12/2015 |
| TW | M305444 U | 1/2007 |

*Primary Examiner* — Sonya D. McCall-Shepard
(74) *Attorney, Agent, or Firm* — Chen Yoshimura LLP

(57) ABSTRACT

A semiconductor package structure is disclosed. The package structure includes a first substrate, a second substrate on which the first substrate is disposed, and a semiconductor chip which is disposed on the first substrate. The two substrates can include two notches or two solder receiving portions. Therefore, when the package structure is disposed on the printed circuit board (PCB), the package structure will protrude less on the surface of the printed circuit board (PCB); or, the solders on the printed circuit board (PCB) will not be shifted by the package structure.

19 Claims, 16 Drawing Sheets

Related U.S. Application Data filed on Jan. 3, 2018, provisional application No. 62/651,609, filed on Apr. 2, 2018.

(51) Int. Cl.
*H01L 33/56* (2010.01)
*H01L 33/62* (2010.01)
*H01S 5/022* (2006.01)
*H01L 23/00* (2006.01)
*H01L 23/13* (2006.01)
*H01L 23/31* (2006.01)
*H05K 3/34* (2006.01)
*H05K 1/11* (2006.01)

SEMICONDUCTOR PACKAGE STRUCTURE

CROSS-REFERENCES TO RELATED APPLICATIONS

This application claims priorities to a U.S. Provisional Application No. 62/550,694 filed on Aug. 27, 2017, a U.S. Provisional Application No. 62/613,056 filed on Jan. 3, 2018 and a U.S. Provisional Application No. 62/651,609 filed on Apr. 2, 2018, all of which are incorporated by reference herein in their entirety.

BACKGROUND OF THE INVENTION

Field of the Invention

The present invention relates to a package structure, and more particularly, relates to a semiconductor package structure.

Descriptions of the Related Art

A semiconductor chip (e.g., an IC chip, an LED chip and a sensor chip or the like) is commonly disposed in a package structure so that the package structure may protect the semiconductor chip to a certain degree; and an assembly of the semiconductor chip and the package structure may be referred to as a semiconductor package structure.

The semiconductor package structure has been applied to various electronic products. As the volume of the electronic products has been designed to be thinned (microminiaturized) in recent years (especially for consumer electronic products), the volume of the semiconductor package structure accordingly needs to be reduced. However, the reduction in the volume is not only limited by the manufacturing capability, but also is limited by design requirements of the semiconductor package structure.

Taking a side view semiconductor package structure as an example, the semiconductor package structure is mounted on a printed circuit board (PCB) of an electronic product, and the thickness of the semiconductor package structure will influence the overall thickness of the electronic product. The reduction in the thickness of the semiconductor package structure (i.e., the reduction in the width of the bottom thereof) is limited by the inner space required for chip bonding (e.g., wire bonding). Moreover, when the width of the bottom is reduced, the diameter of the lens for receiving or transmitting signals (light) also needs to be reduced. However, in this way, the angle for signal transmitting and receiving is reduced, thereby limiting the capability of the semiconductor package structure in signal transmitting and receiving. Additionally, when the width of the bottom is reduced, the size of the electrode (pad) thereof is also reduced so that the pushing force that the electrode can bear may be relatively low.

On the other hand, the semiconductor package structure may also be implemented as a side view light emitting device, which may be disposed in a backlight module of a display screen. As the display screen of the electronic product is designed to have a high aspect ratio, the side view light emitting device not only needs a smaller volume, but also needs a denser arrangement to improve the display brightness. However, when the side view light emitting device is soldered onto a printed circuit board (PCB), the solder on a soldering region of the printed circuit board (PCB) may be shifted by being pressed, thereby causing problems such as short circuit caused by contact of the solder with other devices, conductors or electrodes or the like. In order to prevent these problems, a certain distance needs to be maintained between the side view light emitting devices, and this makes denser arrangement impossible.

Additionally, the light emitting device often comprises encapsulant which may be silicone, and the silicone intends to collapse and deform when being baked at a high temperature so that the silicone cannot maintain a predetermined shape (i.e., an encapsulant collapsing phenomenon will occur). If the conventional methyl-based silicone of high thixotropy is used as the encapsulant, the hardness of the encapsulant after being cured is insufficient although the encapsulant is less likely to collapse. Moreover, the humidity resistance or the sulfur resistance of the methyl-based silicone is also relatively poor.

Accordingly, there are still many problems to be solved in the technical field of the semiconductor package structure.

SUMMARY OF THE INVENTION

An objective of the present invention is to provide a semiconductor package structure which is not entirely disposed on the surface of a printed circuit board (PCB), so the semiconductor package structure protrudes less on the surface of the printed circuit board (PCB), thereby reducing the overall thickness of an electronic product.

An objective of the present invention is to provide another semiconductor package structure, which can improve or prevent the shift of the solder on the printed circuit board (PCB) so that a plurality of semiconductor package structures can be arranged on the printed circuit board (PCB) more densely.

An objective of the present invention is to provide another semiconductor package structure, which comprises a first substrate and a second substrate to advantageously form particular structures such as protrusions or solder receiving portions or the like to achieve the effect of protruding less on the printed circuit board (PCB) or improving the shift of the solder.

To achieve the aforesaid objectives, a semiconductor package structure disclosed in the present invention comprises a semiconductor package structure, and the semiconductor package structure comprises: a first substrate, comprising a base portion, a first protrusion and a second protrusion, the base portion comprising a first front surface, a first side surface and a second side surface, the first protrusion and the second protrusion respectively extending from the first side surface and the second side surface and respectively comprising a first connection surface and a second connection surface, the first connection surface and the second connection surface respectively connecting to the first side surface and the second side surface; a second substrate, comprising a second front surface, the first substrate being disposed on a portion of the second front surface; and a semiconductor chip, being disposed on the first front surface of the base portion.

Preferably, the first substrate further comprises a conductive pattern layer, the conductive pattern layer is disposed on the first front surface, the first side surface and the second side surface of the base portion and is electrically connected with the semiconductor chip.

Preferably, the first substrate further comprises a conductive pattern layer, the conductive pattern layer is disposed on the first front surface of the base portion and the first connection surface and the second connection surface of the first protrusion and the second protrusion and is electrically connected with the semiconductor chip.

Preferably, a first notch and a second notch are defined between the first substrate and the second substrate, the first notch is defined between the second front surface, the first side surface and the first connection surface, and the second notch is defined between the second front surface, the second side surface and the second connection surface.

Preferably, the second substrate further comprises a rear surface and another conductive pattern layer, the rear surface is electrically connected with the second front surface, and the another conductive pattern layer is disposed on the rear surface.

To achieve the aforesaid objective, the present invention additionally discloses an electronic device, which comprises: a semiconductor structure; and a printed circuit board (PCB), comprising an PCB cutout, the first substrate and the second substrate of the semiconductor package structure being partially located within the PCB cutout, and the semiconductor package structure being electrically connected with the printed circuit board (PCB).

Preferably, the printed circuit board (PCB) further comprises a first supporting portion and a second supporting portion, the first supporting portion and the second supporting portion are separated by the PCB cutout; the first protrusion and the second protrusion are respectively located on the first supporting portion and the second supporting portion.

Preferably, the semiconductor chip is also located within the PCB cutout.

To achieve the aforesaid objective, another semiconductor package structure disclosed in the present invention comprises: a first substrate, comprising a first front surface and a first rear surface; a second substrate, comprising a second front surface, a second rear surface, a lower surface and a plurality of first solder receiving portions, the first solder receiving portions being disposed on the lower surface, the first substrate being disposed on the second front surface, and the first substrate being electrically connected with the second substrate; and a semiconductor chip, being disposed on the first front surface and electrically connected to the first substrate.

Preferably, each of the first solder receiving portions comprises a groove, the second substrate further comprises a plurality of electrodes, and the electrodes are respectively exposed in the first solder receiving portions.

Preferably, each of the first solder receiving portions comprises a groove penetrating through the second front surface and the second rear surface.

Preferably, the first solder receiving portions are respectively located at two side edges or two corners of the lower surface.

Preferably, the second substrate further comprises a second solder receiving portion, and the second solder receiving portion is disposed on the lower surface and located between the first solder receiving portions.

Preferably, the semiconductor package structure disclosed in the present invention further comprises a first encapsulant and a second encapsulant, the first encapsulant covers the semiconductor chip, and the second encapsulant surrounds the first encapsulant and exposes a light-exiting surface of the first encapsulant.

Preferably, the second encapsulant is a light reflective structure or a light absorption structure.

Preferably, the first substrate further comprises a conductive pattern layer, the conductive pattern layer is disposed on the first front surface, is electrically connected with the semiconductor chip and is surrounded by the second encapsulant.

Preferably, the first encapsulant is silicone, and the silicone comprises hydrotropic silica.

Preferably, the silicone is a phenyl-based silicone, and the hydrotropic silica is hydrotropic fumed silica.

Preferably, the silicone further comprises an additive that can form a hydrogen bond with a silanol group.

Preferably, the additive comprises at least one of function groups of epoxy, methacryloxy, and isocyanato.

On the other hand, the semiconductor package structure proposed by the present invention may be implemented as follows:

The present invention provides a semiconductor package structure, the semiconductor package structure comprises: a substrate, having a top surface, a bottom surface, a first side edge, a second side edge, a third side edge and a fourth side edge, the top surface being opposite to the bottom surface, the first side edge being opposite to the second side edge, the third side edge being opposite to the fourth side edge, the first side edge and the third side edge connecting to the second side edge and the fourth side edge, the first side edge, the second side edge, the third side edge and the fourth side edge connecting to the top surface and the bottom surface, the top surface of the substrate having a receiving space; a semiconductor chip, being disposed in the receiving space; and a conductive pattern, being disposed on the top surface of the substrate and electrically connected with the semiconductor chip.

In the aforesaid semiconductor package structure, the receiving space comprises a base, and the semiconductor chip is disposed on the base.

In the aforesaid semiconductor package structure, the substrate has a first soldering terminal and a second soldering terminal.

In the aforesaid semiconductor package structure, the conductive pattern comprises a first conductive pattern and a second conductive pattern, and the semiconductor chip is electrically connected with the first conductive pattern and the second conductive pattern respectively.

In the aforesaid semiconductor package structure, the substrate has a first protruding portion and a second protruding portion.

In the aforesaid semiconductor package structure, the first soldering terminal is formed by the first conductive pattern at a side edge of the first protruding portion.

In the aforesaid semiconductor package structure, the second soldering terminal is formed by the second conductive pattern at a side edge of the second protruding portion.

In the aforesaid semiconductor package structure, the bottom surface of the substrate has a third conductive pattern and a fourth conductive pattern, and the third conductive pattern and the fourth conductive pattern are electrically connected with the first conductive pattern and the second conductive pattern respectively.

In the aforesaid semiconductor package structure, the substrate comprises polyimide, epoxy or phenolic resin.

In the aforesaid semiconductor package structure, the semiconductor chip is electrically connected to the conductive pattern via at least one bonding wire.

In the aforesaid semiconductor package structure, the semiconductor chip comprises a light emitting diode chip, a laser diode chip, a photosensitive chip, a photodiode chip or a phototransistor chip.

In the aforesaid semiconductor package structure, the receiving space is filled with an optical plastic.

In the aforesaid semiconductor package structure, the optical plastic comprises epoxy or silicone.

The present invention provides a semiconductor package structure, which comprises: a substrate, comprising a top surface and a bottom surface opposite to each other, a first protruding portion and a second protruding portion extending from two ends of the top surface; a semiconductor chip, being disposed on the top surface; and a conductive pattern, being disposed on the top surface and electrically connected with the semiconductor chip.

In the aforesaid semiconductor package structure, the top surface comprises a base, and the semiconductor chip is disposed on the base.

In the aforesaid semiconductor package structure, a side edge of the first protruding portion comprises a first soldering terminal.

In the aforesaid semiconductor package structure, a side edge of the first protruding portion comprises a second soldering terminal.

In the aforesaid semiconductor package structure, the conductive pattern comprises a first conductive pattern and a second conductive pattern, and the semiconductor chip is electrically connected with the first conductive pattern and the second conductive pattern respectively.

In the aforesaid semiconductor package structure, the first soldering terminal is formed by the first conductive pattern.

In the aforesaid semiconductor package structure, the second soldering terminal is formed by the second conductive pattern.

In the aforesaid semiconductor package structure, the bottom surface of the substrate has a third conductive pattern and a fourth conductive pattern, and the third conductive pattern and the fourth conductive pattern are electrically connected with the first conductive pattern and the second conductive pattern respectively.

In the aforesaid semiconductor package structure, the substrate comprises polyimide, epoxy or phenolic resin.

In the aforesaid semiconductor package structure, the semiconductor chip is electrically connected to the conductive pattern via at least one bonding wire.

In the aforesaid semiconductor package structure, the semiconductor chip may be a light emitting diode chip, a laser diode chip, a photosensitive chip, a photodiode chip or a phototransistor chip.

In the aforesaid semiconductor package structure, an optical plastic covers the semiconductor chip on the top surface.

In the aforesaid semiconductor package structure, the optical plastic comprises epoxy or silicone.

The present invention provides a method for manufacturing a semiconductor package structure, which comprises: providing a substrate which comprises a top surface and a bottom surface, a first protruding portion and a second protruding portion extending from two ends of the top surface, the top surface comprising a conductive pattern; and providing a semiconductor chip, the semiconductor chip being electrically connected with the conductive pattern.

In the aforesaid manufacturing method of the semiconductor package structure, the substrate is formed by open molding.

In the aforesaid manufacturing method of the semiconductor package structure, the top surface comprises a base, and the semiconductor chip is disposed on the base.

In the aforesaid manufacturing method of the semiconductor package structure, a side edge of the first protruding portion comprises a first soldering terminal.

In the aforesaid manufacturing method of the semiconductor package structure, a side edge of the first protruding portion comprises a second soldering terminal.

In the aforesaid manufacturing method of the semiconductor package structure, the conductive pattern comprises a first conductive pattern and a second conductive pattern, and the semiconductor chip is electrically connected with the first conductive pattern and the second conductive pattern respectively.

In the aforesaid manufacturing method of the semiconductor package structure, the first soldering terminal is formed by the first conductive pattern.

In the aforesaid manufacturing method of the semiconductor package structure, the second soldering terminal is formed by the second conductive pattern.

In the aforesaid manufacturing method of the semiconductor package structure, the bottom surface of the substrate has a third conductive pattern and a fourth conductive pattern, and the third conductive pattern and the fourth conductive pattern are electrically connected with the first conductive pattern and the second conductive pattern respectively.

In the aforesaid manufacturing method of the semiconductor package structure, the substrate comprises polyimide, epoxy or phenolic resin.

In the aforesaid manufacturing method of the semiconductor package structure, the semiconductor chip is connected to the conductive pattern via at least one bonding wire.

In the aforesaid manufacturing method of the semiconductor package structure, the semiconductor chip comprises a light emitting diode chip, a laser diode chip, a photosensitive chip, a photodiode chip or a phototransistor chip.

In the aforesaid manufacturing method of the semiconductor package structure, an optical plastic covers the semiconductor chip on the top surface.

In the aforesaid manufacturing method of the semiconductor package structure, the optical plastic comprises epoxy or silicone.

The present invention provides an electronic device comprising a printed circuit board (PCB) having a PCB cutout, wherein a part of the semiconductor package structure is disposed in the PCB cutout, and the side view semiconductor package structure is electrically connected with the printed circuit board (PCB).

In the aforesaid electronic device, the semiconductor package structure is soldered onto the printed circuit board (PCB) via soldering.

The present invention provides a semiconductor package structure, which comprises: a substrate, comprising a top surface and a bottom surface opposite to each other, the top surface having a first corner notch and a second corner notch adjacent to each other; a first conductive pattern, being disposed on the top surface, and forming a first soldering terminal at a side edge of the first corner notch; a second conductive pattern, being disposed on the top surface, and forming a second soldering terminal at a side edge of the second corner notch; and a semiconductor chip, being disposed on the top surface, and electrically connected with the first conductive pattern and the second conductive pattern respectively.

In the aforesaid semiconductor package structure, the bottom surface of the substrate has a third conductive pattern and a fourth conductive pattern, and the third conductive pattern and the fourth conductive pattern are electrically connected with the first conductive pattern and the second conductive pattern respectively.

In the aforesaid semiconductor package structure, the substrate comprises polyimide, epoxy or phenolic resin.

In the aforesaid semiconductor package structure, the semiconductor chip is electrically connected to the first conductive pattern via at least one bonding wire.

In the aforesaid semiconductor package structure, the semiconductor chip is electrically connected to the first conductive pattern and the second conductive pattern via two bonding wires.

In the aforesaid semiconductor package structure, the semiconductor chip comprises a light emitting diode chip, a laser diode chip, a photosensitive chip, a photodiode chip or a phototransistor chip.

In the aforesaid semiconductor package structure, an optical plastic covers the semiconductor chip on the top surface.

In the aforesaid semiconductor package structure, the optical plastic comprises epoxy or silicone.

In the aforesaid semiconductor package structure, an optical axis of the semiconductor chip is perpendicular to the top surface.

In the aforesaid semiconductor package structure, a visible light emitting package structure, an invisible light emitting package structure, an infrared light emitting package structure, an ultraviolet light emitting package structure, a visible light receiving package structure, an invisible light receiving package structure, an infrared light receiving package structure, an ultraviolet light receiving package structure, a visible light transceiving package structure, an invisible light transceiving package structure, an infrared light transceiving package structure or an ultraviolet light transceiving package structure are included.

In the aforesaid semiconductor package structure, the first soldering terminal further extends to the top surface.

In the aforesaid semiconductor package structure, the second soldering terminal further extends to the top surface.

In the aforesaid semiconductor package structure, the substrate comprises a first substrate portion and a second substrate portion, the second substrate portion is disposed on the top surface of the first substrate portion, the top surface is the top surface of the second substrate portion, the second substrate portion is a T-shaped structure, the second substrate portion and the first substrate portion together define the first corner notch and the second corner notch, and the first corner notch and the second corner notch expose a part of the top surface of the first substrate portion.

The present invention provides an electronic device comprising a printed circuit board (PCB) having a PCB cutout, wherein a part of the semiconductor package structure is disposed in the PCB cutout, and the side view semiconductor package structure is electrically connected with the printed circuit board (PCB).

In the aforesaid electronic device, the semiconductor package structure is soldered onto the printed circuit board (PCB) via soldering.

The present invention provides a semiconductor package structure which comprises: a substrate, having a top surface; a first conductive pattern, being disposed on the top surface and having a first soldering terminal; a second conductive pattern, being disposed on the top surface and having a second soldering terminal; a semiconductor chip, being disposed on the top surface and having a second soldering terminal; a semiconductor chip, being disposed on the top surface and electrically connected with the first conductive pattern and the second conductive pattern respectively; and wherein an optical axis of the semiconductor chip is perpendicular to the top surface.

In the aforesaid semiconductor package structure, the substrate further has a bottom surface opposite to the top surface, the bottom surface has a third conductive pattern and a fourth conductive pattern, and the third conductive pattern and the fourth conductive pattern are electrically connected with the first conductive pattern and the second conductive pattern respectively.

In the aforesaid semiconductor package structure, the substrate comprises polyimide, epoxy or phenolic resin.

In the aforesaid semiconductor package structure, the semiconductor chip is electrically connected to the first conductive pattern via at least one bonding wire.

In the aforesaid semiconductor package structure, the semiconductor chip is electrically connected to the first conductive pattern and the second conductive pattern via two bonding wires.

In the aforesaid semiconductor package structure, the semiconductor chip comprises a light emitting diode chip, a laser diode chip, a photosensitive chip, a photodiode chip or a phototransistor chip.

In the aforesaid semiconductor package structure, an optical plastic covers the semiconductor chip on the top surface.

In the aforesaid semiconductor package structure, the optical plastic comprises epoxy or silicone.

In the aforesaid semiconductor package structure, a visible light emitting package structure, an invisible light emitting package structure, an infrared light emitting package structure, an ultraviolet light emitting package structure, a visible light receiving package structure, an invisible light receiving package structure, an infrared light receiving package structure, an ultraviolet light receiving package structure, a visible light transceiving package structure, an invisible light transceiving package structure, an infrared light transceiving package structure or an ultraviolet light transceiving package structure are included.

In the aforesaid semiconductor package structure, the first soldering terminal further extends to the top surface.

In the aforesaid semiconductor package structure, the second soldering terminal further extends to the top surface.

In the aforesaid semiconductor package structure, the substrate comprises a first substrate portion and a second substrate portion, the second substrate portion is disposed on the top surface of the first substrate portion, the top surface is the top surface of the second substrate portion, the second substrate portion is a T-shaped structure, the second substrate portion, the first substrate portion, the first conductive pattern and the second conductive pattern together define the first soldering terminal and the second soldering terminal.

The present invention provides an electronic device which comprises a printed circuit board (PCB) having a PCB cutout, wherein a part of the semiconductor package structure of any of implementations 58 to 69 is disposed in the PCB cutout, and the semiconductor package structure is electrically connected with the printed circuit board (PCB).

In the aforesaid electronic device, the semiconductor package structure is soldered on the printed circuit board (PCB) via soldering.

In an embodiment, the semiconductor chip may be a vertical chip, a top electrode of the semiconductor chip is electrically connected with the second conductive pattern via a bonding wire, and a bottom electrode of the semiconductor chip is soldered and electrically connected with the first conductive pattern.

In an embodiment, the semiconductor chip may be a horizontal chip, and two top electrodes of the semiconductor chip are electrically connected with the first conductive pattern and the second conductive pattern respectively via two bonding wires.

In an embodiment, the semiconductor chip may be a flip chip, and two electrodes of the semiconductor chip are soldered and electrically connected with the first conductive pattern and the second conductive pattern respectively.

In an embodiment, the semiconductor package structure may be soldered and electrically connected with a first soldering pattern and a second soldering pattern of the printed circuit board (PCB) respectively via the first soldering terminal and the second soldering terminal, thereby forming the side view semiconductor package structure.

In an embodiment, the semiconductor package structure may be soldered and electrically connected with the first soldering pattern and the second soldering pattern of the printed circuit board (PCB) respectively via the third conductive pattern and the fourth conductive pattern, thereby forming a top view semiconductor package structure.

Accordingly, the semiconductor package structure of the present invention may at least provide the following benefits:

1. the semiconductor package structure may be disposed on a printed circuit board (PCB) of an electronic product and located within an PCB cutout of the printed circuit board (PCB) instead of being entirely located on the surface of the printed circuit board (PCB). Specifically, the protruding amount of the semiconductor package structure with respect to the surface of the printed circuit board (PCB) may be smaller than the thickness of the semiconductor package structure. Therefore, the housing of the electronic product may be designed to be relatively thin, i.e., to sufficiently receive the semiconductor package structure; alternatively, the housing may have a special shape in response to the protruding amount of the semiconductor package structure so that the housing is more attractive in appearance.

2. the semiconductor package structure can maintain the required internal wire bonding space and meet design requirements such as the diameter of a required lens while having a smaller protruding amount with respect to the surface of the printed circuit board (PCB); namely, element design requirements will not be compromised due to the reduction in the protruding amount of the semiconductor package structure.

3. the semiconductor package structure comprises a first substrate and a second substrate stacked together, which facilitates the formation of the protrusions and/or the solder receiving regions and enhances the heat-dissipating effect of the substrate. Moreover, if the first substrate is cut accidentally when the encapsulant is cut and removed, the circuit conduction path inside the semiconductor package structure will not be damaged.

4. when the semiconductor package structure is disposed on the printed circuit board (PCB), a plurality of solder receiving regions of the second substrate thereof may receive the solder on the printed circuit board (PCB) so that the second substrate will not press the solder excessively, thereby improving or avoiding the shift of the solder. In this way, a plurality of semiconductor package structures may be arranged on the printed circuit board (PCB) more densely, and short circuit will not occur therebetween due to the shift of the solder.

5. the first encapsulant may be silicone comprising hydrotropic silica and thus has relatively high thixotropy, thereby preventing or improving the collapse of the first encapsulant when being baked at a high temperature. Moreover, the first encapsulant may have relatively high hardness after the molding (being cured), so the first encapsulant is less likely to be deformed during the molding of the second encapsulant. Additionally, the first encapsulant may also have good humidity resistance and sulfur resistance, so the humidity and sulfur in the environment will not easily enter into or penetrate through the first encapsulant. In this way, the fluorescent material in the first encapsulant is less likely to be influenced by the humidity, and metal materials such as the conductive pattern layer of the semiconductor chip or the like is less likely to be sulfurized.

6. the first encapsulant may also comprise an additive that can form a hydrogen bond with a silanol group, thereby achieving the effect of prolonging the thixotropy. Additionally, the first encapsulant may also achieve a refractive index above 1.5.

The present invention may provide a semiconductor package structure, which comprises:
    a substrate, comprising:
      a first substrate, comprising a base portion, a first protrusion and a second protrusion, the base portion comprising a first front surface, a first side surface and a second side surface, the first protrusion and the second protrusion respectively extending from the first side surface and the second side surface and respectively comprising a first connection surface and a second connection surface, the first connection surface and the second connection surface respectively connecting to the first side surface and the second side surface; and
      a second substrate, comprising a second front surface, the first substrate being disposed on a portion of the second front surface, the first substrate and the second substrate being formed integrally; and
    a semiconductor chip, being disposed on the first front surface of the base portion.

The present invention further provides a semiconductor package structure, which comprises:
    a substrate, comprising:
      a first substrate, comprising a first front surface and a first rear surface;
      a second substrate, comprising a second front surface, a second rear surface, a lower surface and a plurality of first solder receiving portions, the first solder receiving portions being disposed on the lower surface, the first substrate being disposed on the second front surface, the first substrate being electrically connected with the second substrate, the first substrate and the second substrate being formed integrally; and
    a semiconductor chip, being disposed on the first front surface and electrically connected to the first substrate.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
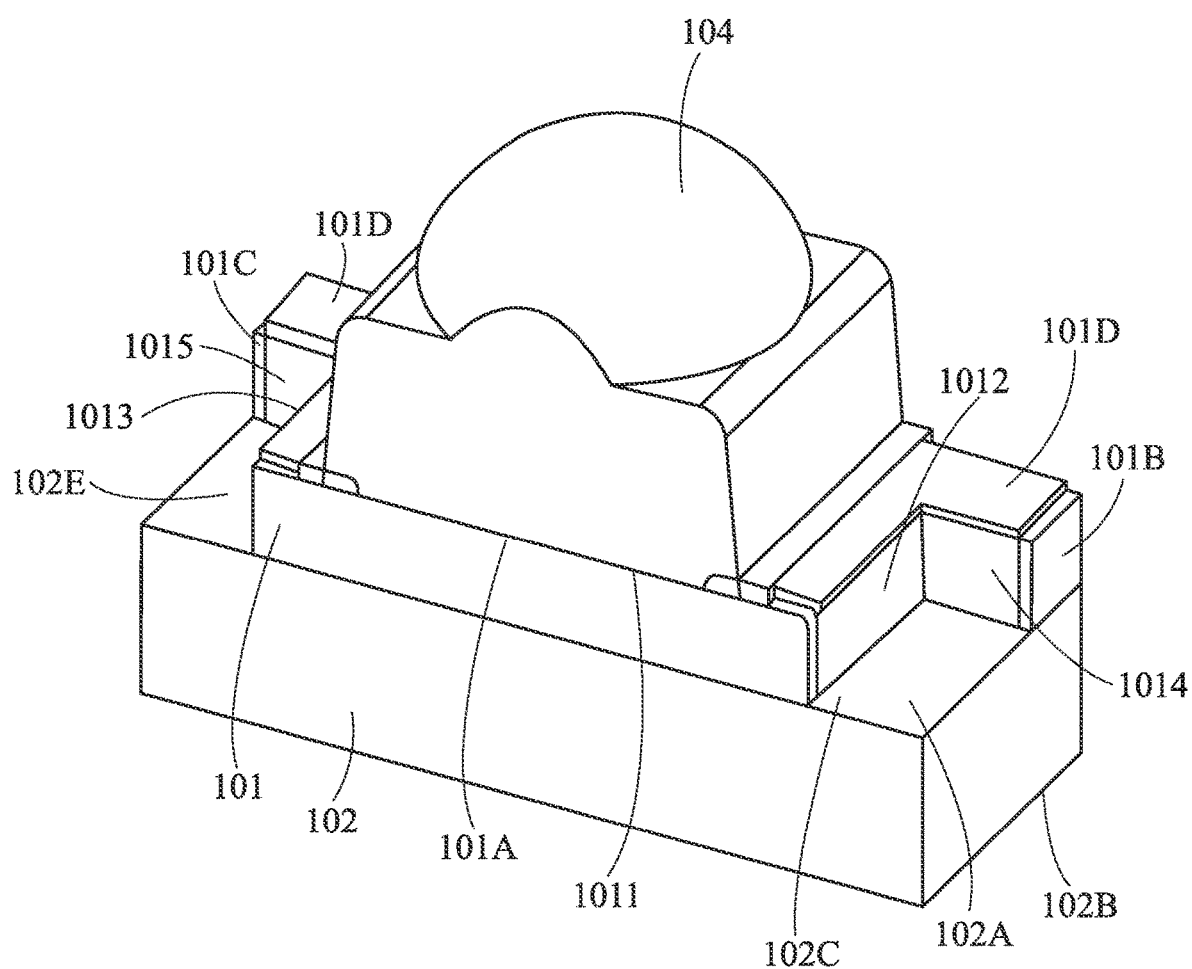
FIG. 1A is a perspective view of a semiconductor package structure according to a first preferred embodiment of the present invention.
Figure 1B:
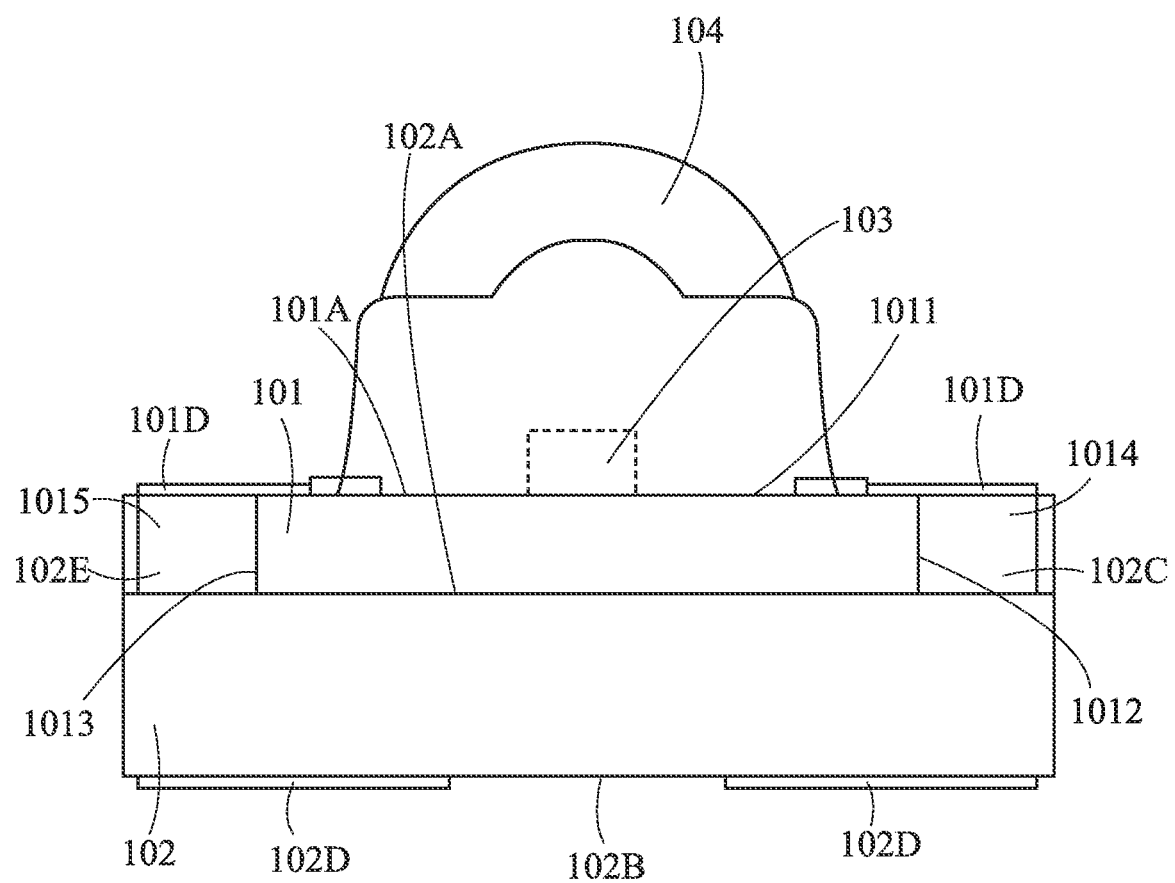
FIG. 1B is a top view of the semiconductor package structure of FIG. 1A.
Figure 1C:
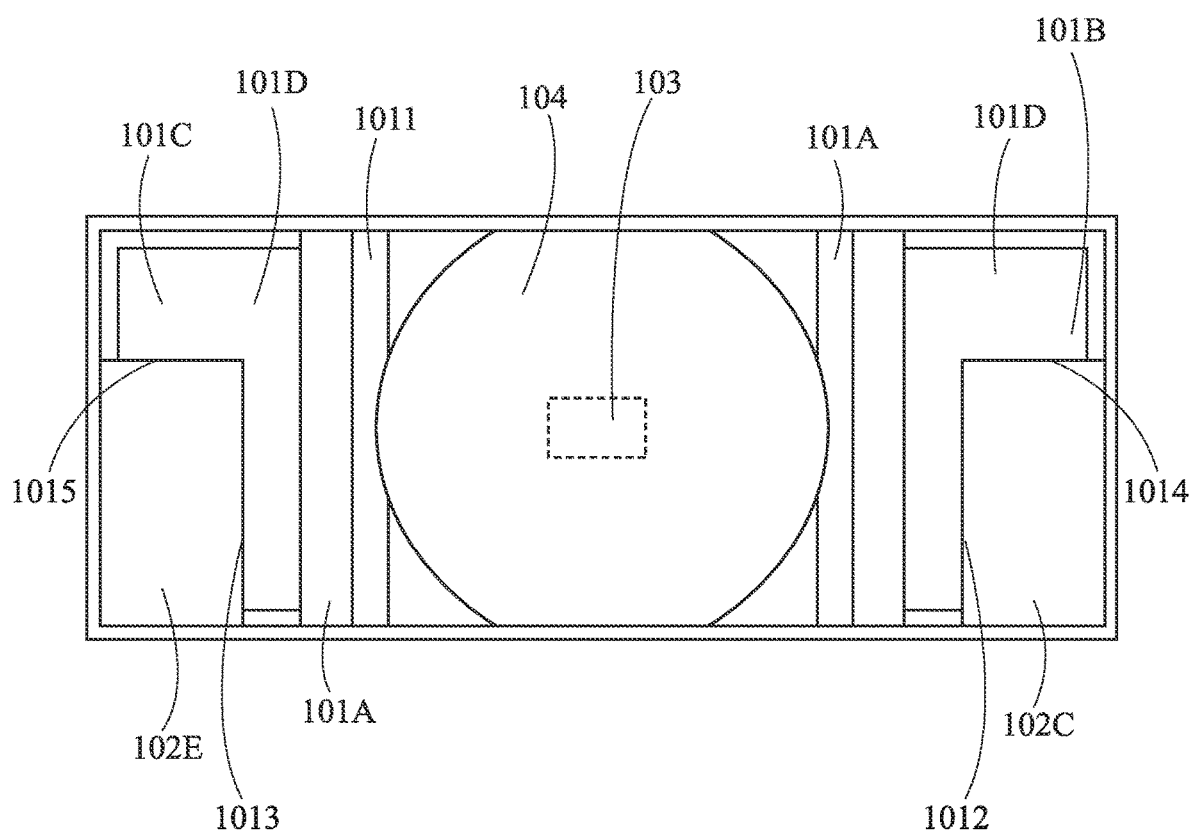
FIG. 1C is a front view of the semiconductor package structure of FIG. 1A.

A part of specific embodiments of the present invention will be described specifically hereinafter. However, the present invention may be implemented by embodiments of various forms without departing from the spirit of the present invention, and the claimed scope of the present invention should not be construed as being limited to what described in the specification. Additionally, technical contents of various implementations in the above summary may also serve as technical contents of the embodiments or as possible variants of the embodiments. Moreover, orientations described above (e.g., front, back, upper, lower, two sides or the like) are relative orientations and may be defined according to use states (e.g., the side view type) of the semiconductor package structure.

Referring to FIG. 1A to FIG. 1D, which are a schematic perspective view and corresponding schematic plane views of a semiconductor package structure 10A (which is called a package structure 10A hereinafter) according to a first preferred embodiment of the present invention. The package structure 10A may be a stacked structure of two substrates (substrate portions), and the two substrates may be fixed via hot pressing or adhesion or the like. The package structure 10A comprises a first substrate 101 (which is called a substrate 101 hereinafter), a second substrate 102 (which is called a substrate 102 hereinafter) and a semiconductor chip 103 (e.g., a light emitting diode chip, a laser diode chip, a photosensitive chip, a photodiode chip or a phototransistor chip or the like), which will be further described sequentially hereinafter.

The substrates 101 and 102 may comprise various types of substrates that shall be known in the art, such as a printed circuit (plastic) substrate, a ceramic substrate, a metal substrate or the like, and the substrates 101 and 102 of this embodiment take printed circuit substrates as an example. Structurally, the substrate 101 comprises a base portion 101A, a first protrusion 101B (which is called a protrusion 101B hereinafter) and a second protrusion 101C (which is called a protrusion 101C hereinafter), the base portion 101A may be located between the two protrusions 101B and 101C, and the base portion 101A, the first protrusion 101B and the second protrusion 101C may be formed integrally and may also have the same thickness. Therefore, the substrate 101 is T-shaped in appearance. The base portion 101A and the two protrusions 101B and 101C may be formed by molding, punching and cutting or the like.

Moreover, the base portion (base) 101A may provide a receiving space (e.g., a recess) in which the semiconductor chip 103 may be disposed, and the base portion 101A may comprise a first front surface 1011 (which is called a front surface 1011 hereinafter), a first side surface 1012 (which is called a side surface 1012 hereinafter) and a second side surface 1013 (which is called a side surface 1013 hereinafter), the two side surfaces 1012 and 1013 are respectively connected to two sides of the front surface 1011 and may be perpendicular to the front surface 1011. The semiconductor chip 103 may be disposed on the front surface 1011 and preferably is located at (or near to) the center of the front surface 1011.

The two protrusions 101B and 101C extend respectively from a portion of the side surface 1012 and a portion of the side surface 1013. In other words, the protrusion 101B (101C) does not occupy the entire side surface 1012 (1013). Moreover, the two protrusions 101B and 101C respectively comprise a first connection surface 1014 and a second connection surface 1015 (which are called connection surfaces 1014 and 1015 hereinafter), the two connection surfaces 1014 and 1015 respectively connect to the two side surfaces 1012 and 1013 of the base portion 101A, and the connection surface 1014 (1015) preferably may be perpendicular to the side surface 1012 (1013). Each of the protrusions 101B and 101C comprises a front surface (not labeled in the drawings) and may be connected with respective connection surfaces 1014 and 1015 (preferably connected perpendicularly), and the front surface of the protrusions 101B and 101C may be level and coplanar with the front surface 1011 of the base portion 101A.

Figure 2:
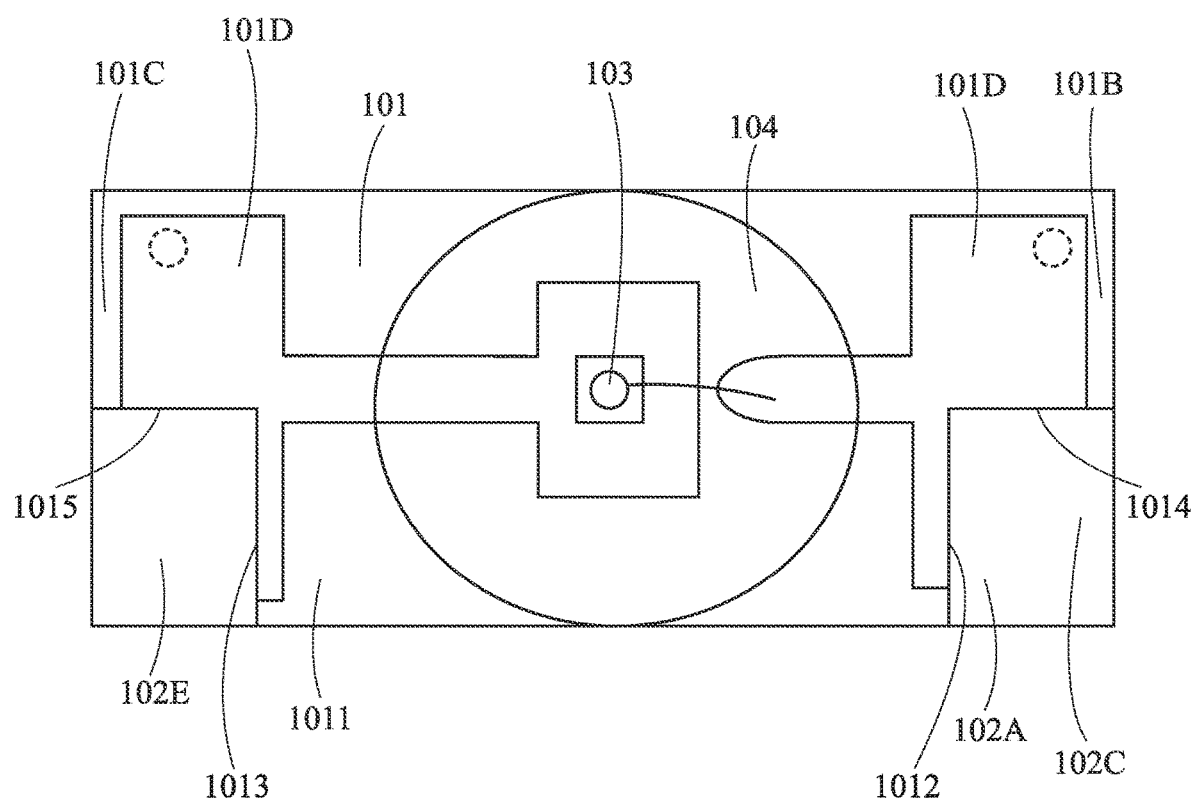
FIG. 2 is another front view of the semiconductor package structure of FIG. 1A.

The substrate 101 may further comprise a conductive pattern layer 101D (which may also be called a printed circuit layer or a metal layer), the conductive pattern layer 101D may be disposed on the front surface 1011, the side surface 1012 and the side surface 1013 of the base portion 101A and may be further disposed on the connection surfaces 1014 and 1015 of the protrusions 101B and 101C and the front surface; and the conductive pattern layer 101D may be electrically connected with the semiconductor chip 103. The conductive pattern layer 101D may be disposed only on a small part of the front surface 1011, i.e., which makes it sufficient to be electrically connected with the semiconductor chip 103. That is, as shown in FIG. 2, an electrode of the semiconductor chip 103 may be directly coupled to a part (i.e., the first conductive pattern) of the conductive pattern layer 101D, and another electrode thereof is coupled to another part (i.e., the second conductive pattern) of the conductive pattern layer 101D via wire bonding. Correspondingly, the conductive pattern layer 101D may be disposed on a great part of the side surfaces 1012 and 1013 or the connection surfaces 1014 and 1015 so that solder 1031 to be described later (as shown in FIG. 3B) will easily contact with the conductive pattern layer 101D or the contact area between the solder 1031 and the conductive pattern layer 101D is increased.

Because the side surfaces 1012 and 1013 or the connection surfaces 1014 and 1015 have the conductive pattern layer 101D disposed thereon, the side surface 1012 or the connection surface 1014 may be called a first soldering terminal, and the side surface 1013 or the connection surface 1015 may be called a second soldering terminal. Therefore, the electric energy applied from the outside may be transferred to two electrodes of the semiconductor chip 103 on the front surface 1011 via the first soldering terminal and the second soldering terminal so that the semiconductor chip 103 can operate (e.g., emit light).

The second substrate 102 may be disposed behind the first substrate 101. In other words, the substrate 102 comprises a second front surface 102A (which is called a front surface 102A hereinafter), and the substrate 101 is disposed on a part of the front surface 102A instead of completely covering the front surface 102A. Therefore, a part of the front surface 102A will be exposed from the substrate 101 so that a first notch 102C and a second notch 102E (which are called notches 102C and 102E hereinafter) may be defined between the substrate 101 and the substrate 102. Specifically, the notch 102C is defined between the front surface 102A, the side surface 1012 and the connection surface 1014, and the notch 102E is defined between the front surface 102A, the side surface 1013 and the connection surface 1015. In other words, the notch 102C and the notch 102E are located respectively at two sides of the base portion 101A of the substrate 101 and located in front of the substrate 102. The notch 102C has a first soldering terminal therein, and the notch 102E has a second soldering terminal therein.

Figure 1D:
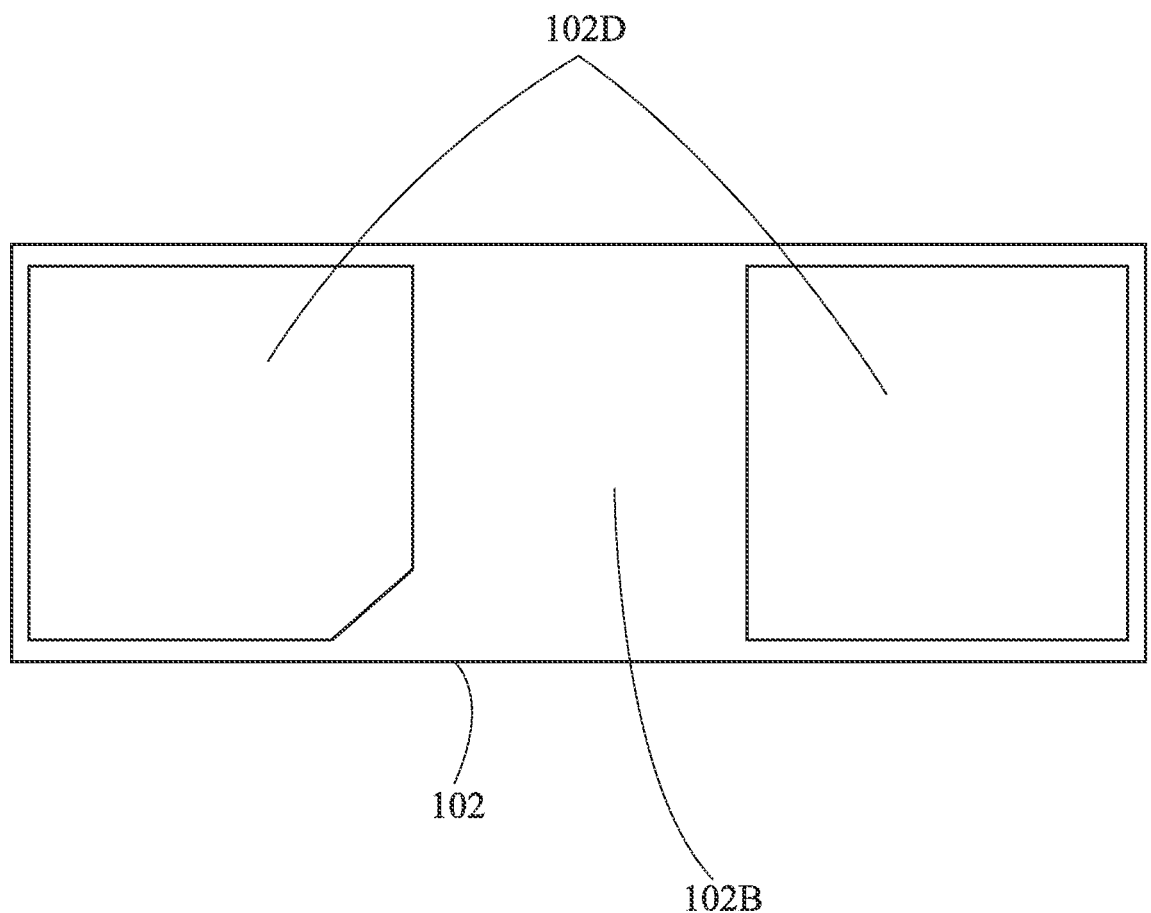
FIG. 1D is a rear view of the semiconductor package structure of FIG. 1A.

Referring to FIG. 1D and FIG. 2 together, the substrate 102 may further comprise a rear surface 102B and a conductive pattern layer 102D, the rear surface 102B are disposed opposite to the front surface 102A, and the conductive pattern layer 102D may be disposed on the front surface 102A and the rear surface 102B. The substrate 102 may comprise a conductive hole (a conductive pillar, as shown in FIG. 2) penetrating through the front surface 102A and the rear surface 102B thereof so that the conductive pattern layers 102D on the front surface 102A and the rear surface 102B are electrically connected with each other. The substrate 101 may also comprise a conductive hole penetrating through the front surface 1011 and the rear surface thereof so that the conductive pattern layers 101D of the substrate 101 and the conductive pattern layer 102D of the substrate 102 may be electrically connected with each other. In this way, the electric energy may be transferred from the conductive pattern layer 102D on the rear surface 102B to the semiconductor chip 103 on the front surface 1011. The conductive pattern layer 102D on the rear surface 102B may constitute another two soldering terminals, and the size of the two soldering terminals may be larger than these of the first soldering terminal and the second soldering terminal so that the two soldering terminals can bear a larger pushing force.

Referring back to FIG. 1A, the package structure 10A may further comprise encapsulant 104 (or called optical plastic), the encapsulant 104 may comprise a transparent high molecular material so that light can penetrate therethrough, and the encapsulant 104 may be formed on the base portion 101A after being cured at a specific shape via molding or the like. The encapsulant 104 may cover the semiconductor chip 103 to protect the semiconductor chip 103. Moreover, the encapsulant 104 is preferably a hemispheroid to form a lens so that light is converged to the semiconductor chip 103. As shown in FIG. 2, the encapsulant 104 covers a part of the conductive pattern layer 101D.

The package structure 10A may be implemented as a side view semiconductor package structure, and depending on the type of the semiconductor chip 103, the package structure 10A may be configured to emit light or detect light (which may be visible light or invisible light). The package structure 10A may be disposed on the printed circuit board (PCB) of an electronic device as an element of the electronic device, and this will be described in detail as follows.

Figure 3A:
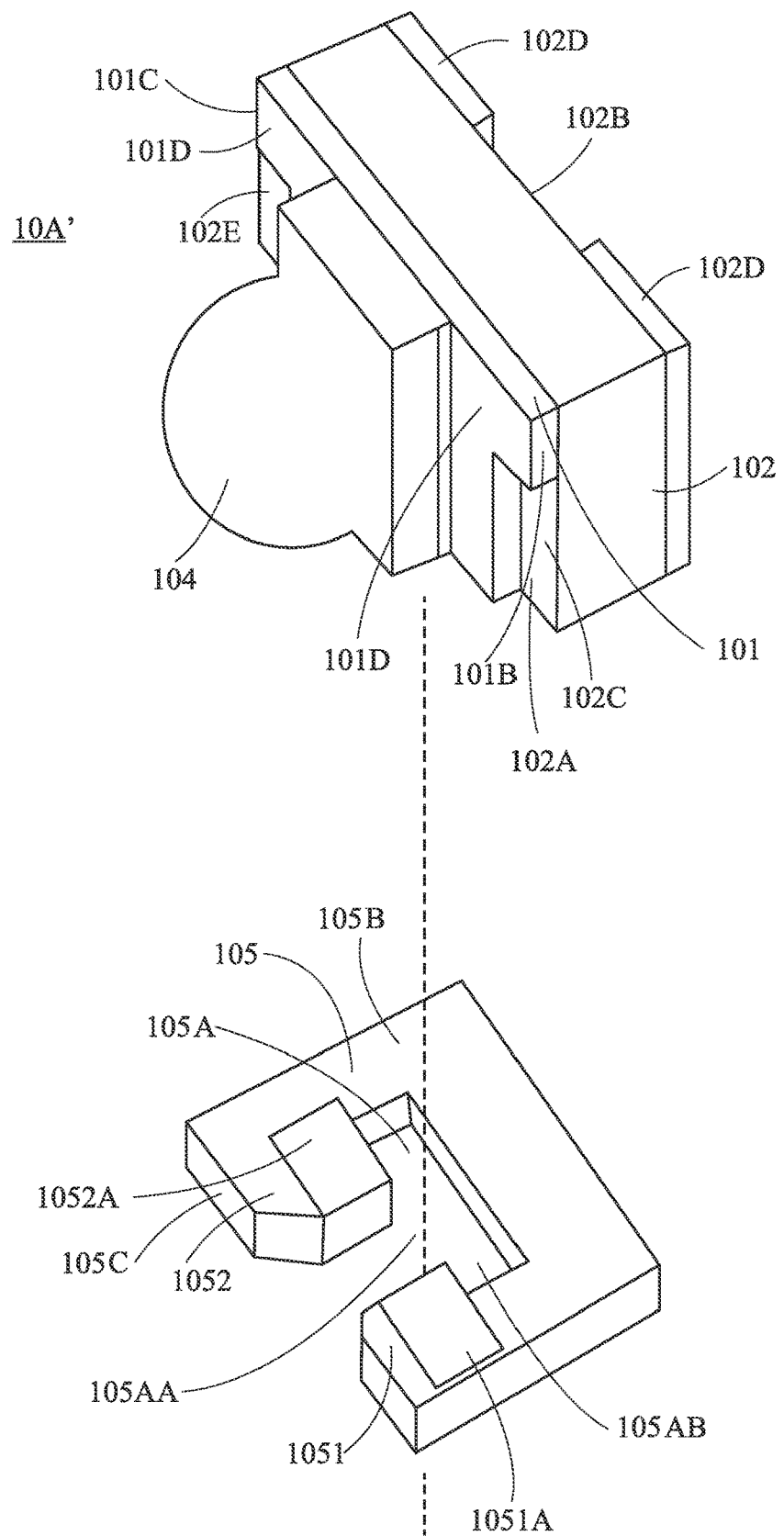
FIG. 3A is a schematic view of assembling an electronic device according to a preferred embodiment of the present invention.
Figure 3B:
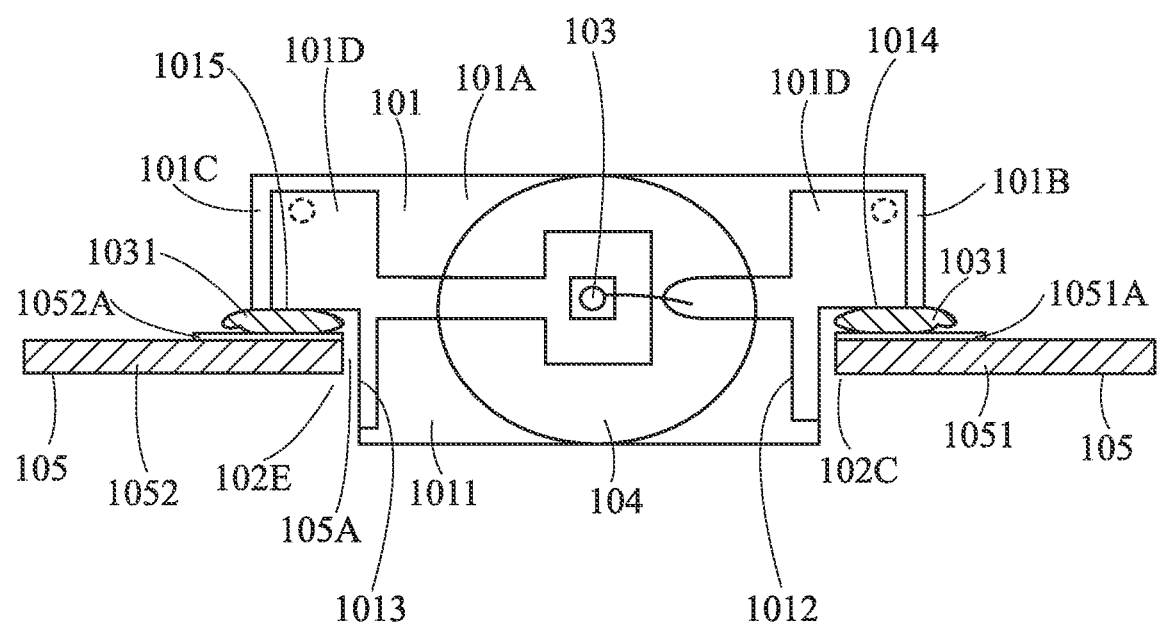
FIG. 3B is a front view of the electronic device of FIG. 3A.

Referring to FIG. 3A and FIG. 3B, which are respectively a perspective view and a front view of an electronic device 10A' according to a preferred embodiment of the present invention. The electronic device 10A' comprises the aforesaid package structure 10A and a printed circuit board (PCB) 105, the printed circuit board (PCB) 105 may comprise an PCB cutout 105A, an upper surface 105B and a front surface 105C, the PCB cutout 105A is disposed on the upper surface 105B and penetrates through the printed circuit board (PCB) 105 along the normal direction of the upper surface 105B, and the PCB cutout 105A further extends to the front surface 105C. The package structure 10A is disposed in the PCB cutout 105A of the printed circuit board (PCB) 105, and because the printed circuit board (PCB) 105 is thinner than the two substrates 101 and 102 of the package structure 10A, the two substrates 101 and 102 are partially located within the PCB cutout 105A and partially protrude outside the PCB cutout 105A. Specifically, the two substrates 101 and 102 of the package structure 10A are not entirely disposed on the upper surface 105B of the printed circuit board (PCB) 105. The two substrates 101 and 102 of the package structure 10A may also be electrically connected with the printed circuit board (PCB) 105.

More specifically, the printed circuit board (PCB) 105 may further comprise a first supporting portion 1051 and a second supporting portion 1052 (which are called supporting portions 1051 and 1052 hereinafter), and the two supporting portions 1051 and 1052 are separated by the PCB cutout 105A. The PCB cutout 105A may comprise a first region 105AA and a second region 105AB (which are called regions 105AA and 105AB hereinafter), the region 105AA is located between the two supporting portions 1051 and 1052, and the region 105AB is located beside the two supporting portions 1051 and 1052. The width of the region 105AA may be slightly larger than the width of the base portion 101A of the substrate 101, and the width of the region 105AB may be slightly larger than the width of the substrate 102. When the package structure 10A is disposed in the PCB cutout 105A, the base portion 101A of the substrate 101 partially goes deep into the region 105AA, the substrate 102 partially goes deep into the region 105AB, and the two protrusions 101B and 101C are respectively located on the two supporting portions 1051 and 1052 (the connection surfaces 1014 and 1015 are towards the supporting portions 1051 and 1052). In this case, the semiconductor chip 103 may be located above the upper surface 105B and towards the region 105AA, and the encapsulant 104 may be partially located within the region 105AA and may protrude from the region 105AA forwardly.

Specifically, the two notches 102C and 102E of the package structure 10A respectively correspond to two supporting portions 1051 and 1052 so that the package structure 10A is supported by the two supporting portions 1051 and 1052 and will not fall off from the PCB cutout 105. The protruding amount of the package structure 10A with respect to the upper surface 105B of the printed circuit board (PCB) 105 is approximately equal to the thickness of the protrusions 101B and 101C.

The package structure 10A is electrically connected with the printed circuit board (PCB) 105 as described above, and preferably, the two supporting portions 1051 and 1052 respectively comprise two electrodes 1051A and 1052A, and the two electrodes 1051A and 1052A may be electrically connected with the first soldering terminal (the side surface 1012 and/or the connection surface 1014) and the second soldering terminal (the side surface 1013 and/or the connection surface 1015) of the package structure 10A respectively. Additionally, the package structure 10A may also be electrically connected with the printed circuit board (PCB) 105 via the conductive pattern layer 102D on the rear surface 102B of the substrate 102. In this case, the printed circuit board (PCB) 105 may comprise another two electrodes (not shown) which are disposed beside the region 105AB of the PCB cutout 105A.

The aforesaid electrical connection may be achieved via the solder 1031 (tin solder) applied onto the printed circuit board (PCB) 105, i.e., the solder 1031 is disposed on the electrodes 1051A and 1052A (and/or the another two electrodes disposed beside the region 105AB), and the solder 1031 contacts with the conductive pattern layer 101D on the two soldering terminals of the package structure 10A (and/or the conductive pattern layer 102D on the rear surface 102B).

Figure 4:
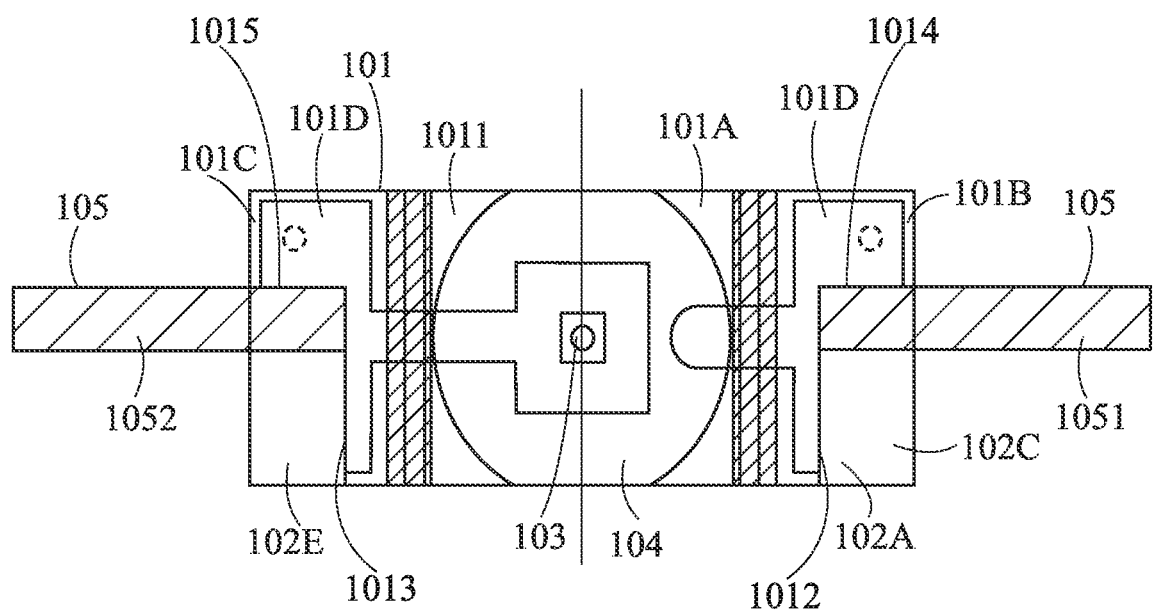
FIG. 4 is another front view of the assemble of the electronic device of FIG. 3A.

Next referring to FIG. 4, in other implementations, the thickness of the protrusions 101B and 101C may be relatively small to reduce the protruding amount of the package structure 10A with respect to the upper surface 105B of the printed circuit board (PCB) 105 and to make the semiconductor chip 103 located within the PCB cutout 105A. Moreover, the package structure 10A is electrically connected with the printed circuit board (PCB) 105 only via the conductive pattern layer 102D on the rear surface 102B, so the connection surfaces 1014 and 1015 of the protrusions 101B and 101C may directly contact with the two supporting portions 1051 and 1052, thereby further reducing the protruding amount of the package structure 10A.

Accordingly, the package structure proposed according to the first preferred embodiment of the present invention may protrude less on the upper surface of the printed circuit board (PCB), but the overall thickness of the package structure may not be reduced correspondingly. In other words, sizes of elements such as the base portion (the conductive pattern layer), the encapsulant (the lens) or the like may not be reduced correspondingly to meet size requirements of these elements.

Figure 5:
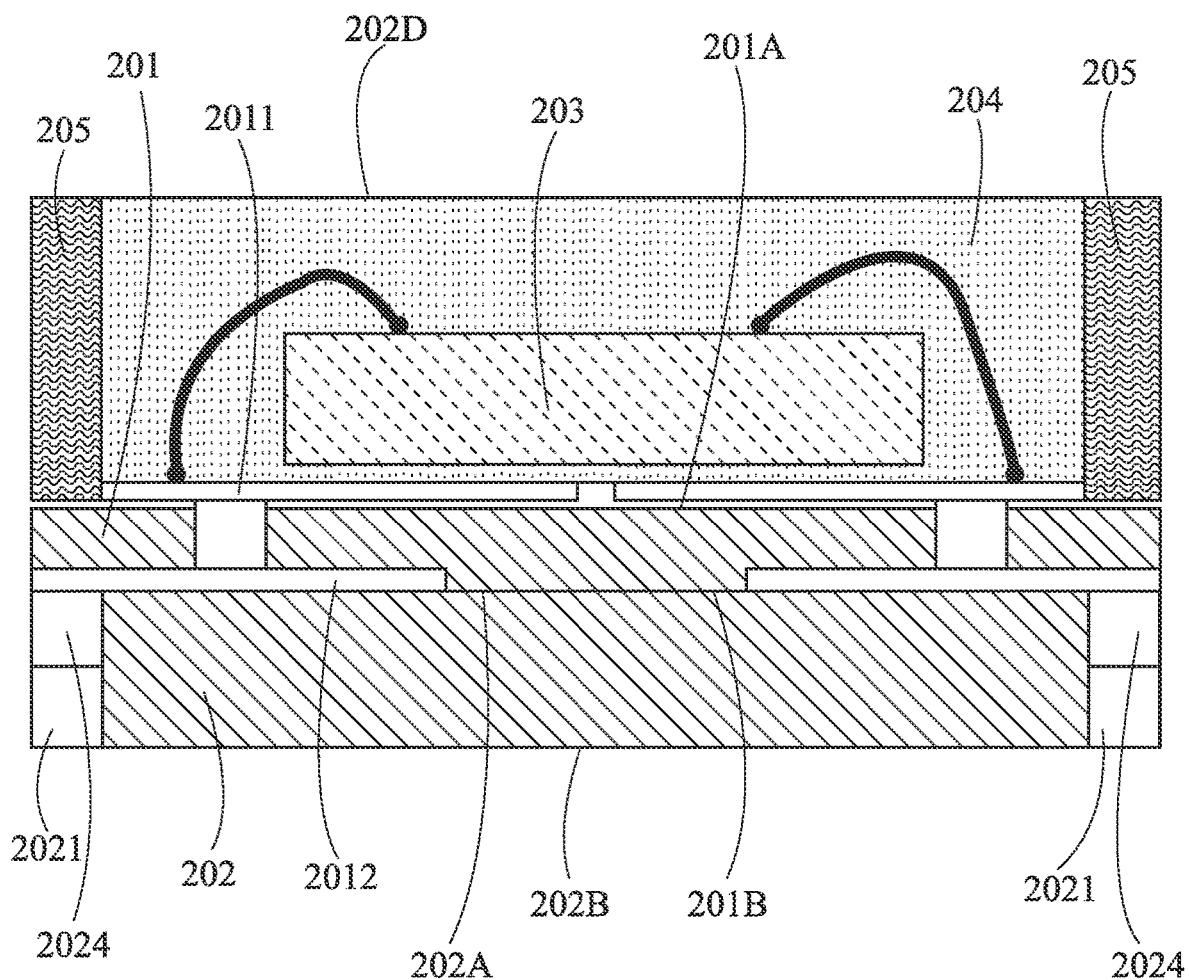
FIG. 5 is a cross-sectional view of a semiconductor package structure according to a second preferred embodiment of the present invention (the line indicating the cross section is as shown in FIG. 6A)
Figure 6A:
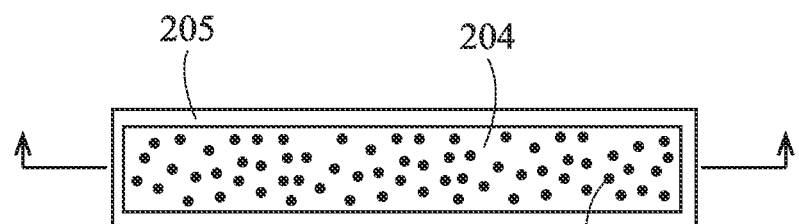
FIG. 6A is a front view of a semiconductor package structure according to the second preferred embodiment of the present invention.
Figure 6B:
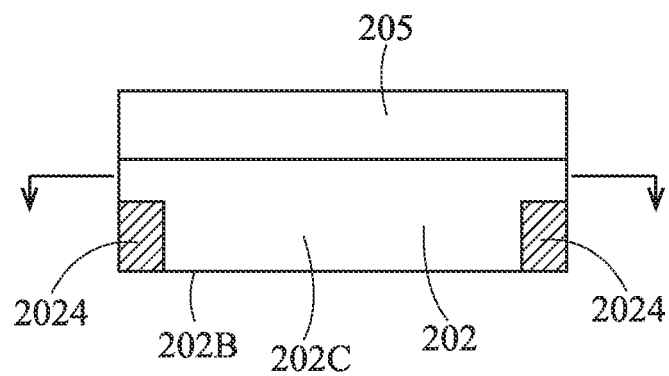
FIG. 6B is a top view of the semiconductor package structure of FIG. 6A.
Figure 6C:
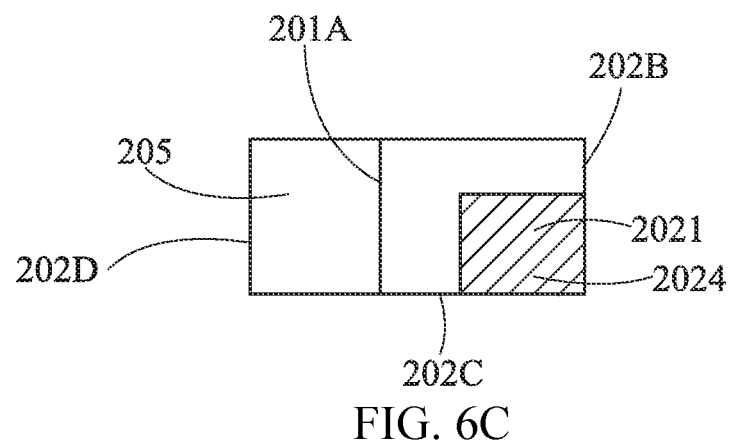
FIG. 6C is a right side view of the semiconductor package structure of FIG. 6A.
Figure 6D:
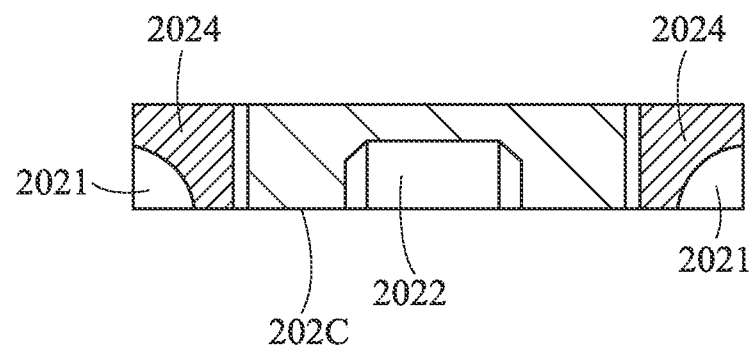
FIG. 6D is another cross-sectional view of the semiconductor package structure according to the second preferred embodiment of the present invention (the line indicating the cross section is as shown in FIG. 6B)

Referring to FIG. 5 to FIG. 6D, a semiconductor package structure 20A (which is called a package structure 20A hereinafter) according to a second preferred embodiment of the present invention will be described hereinafter, and reference may be made to technical contents of the aforesaid package structure 10A for technical contents of the package structure 20A and vice versa, so the same or similar parts will be omitted from description or described briefly.

The package structure 20A is also a stacked structure of two substrates and it may comprise a first substrate 201 (which is called a substrate 201 hereinafter), a second substrate 202 (which is called a substrate 202 hereinafter) and a semiconductor die 203. The substrate 201 is disposed on the substrate 202 and electrically connected with the substrate 202, and the semiconductor die 203 is disposed on the substrate 201 and electrically connected with the substrate 201. Specifically, the semiconductor die 203 may be electrically connected with substrate 202 via the substrate 201. The first substrate 201 and the second substrate 202 may be formed integrally.

More specifically, the substrate 201 comprises a first front surface 201A (which is called a front surface 201A hereinafter) and a first rear surface 201B (which is called a rear surface 201B hereinafter), and the substrate 202 comprises a second front surface 202A (which is called the front surface 202A hereinafter), a second rear surface 202B (which is called a rear surface 202B hereinafter) and a lower surface 202C (as shown in FIG. 6B or FIG. 6D). The substrate 201 is disposed on the front surface 202A of the substrate 202, and the semiconductor die 203 is disposed on the front surface 201A. Additionally, the substrate 201 further comprises a conductor pattern layer 2011 disposed on the front surface 201A, the substrate 202 further comprises a conductor pattern layer 2012 disposed on the front surface 202A, and the two conductor pattern layers 2011 and 2012 may be electrically connected with each other via a conductive via or a conductive pillar (not labeled). The semiconductor die 203 may be electrically connected with the conductor pattern layer 2011 of the substrate 201 via wire bonding or the like.

As shown in FIG. 5, FIG. 6B or FIG. 6D, the substrate 202 may further comprise a plurality of first solder receiving portions 2021 (which are called receiving portions 2021 hereinafter). In this embodiment, two receiving portions are included as an example, but the number of the receiving portions may correspond to the electrodes of the semiconductor die 203. The receiving portions 2021 are disposed on the lower surface 202C and may selectively extend to the rear surface 202B (or extend to the side surface of the substrate 202). In other words, the receiving portions 2021 may be located at two side edges or two corners of the lower surface 202C so as to form openings at the lower surface 202C, the rear surface 202B or the side surface.

On the other hand, each of the receiving portions 2021 may be a groove, the substrate 202 further comprises a plurality of electrodes 2024, and the electrodes 2024 are respectively exposed in the receiving portions 2021 respectively. That is, the electrodes 2024 may be embedded between the front surface 202A and the rear surface 202B of the substrate 202, and part of the electrodes 2024 is exposed in the receiving portion 2021 and may be observed from the receiving portion 2021. Another part of the electrodes 2024 may be exposed from the front surface 202A and electrically connected with the conductive pattern layer 2012.

Figure 6E:
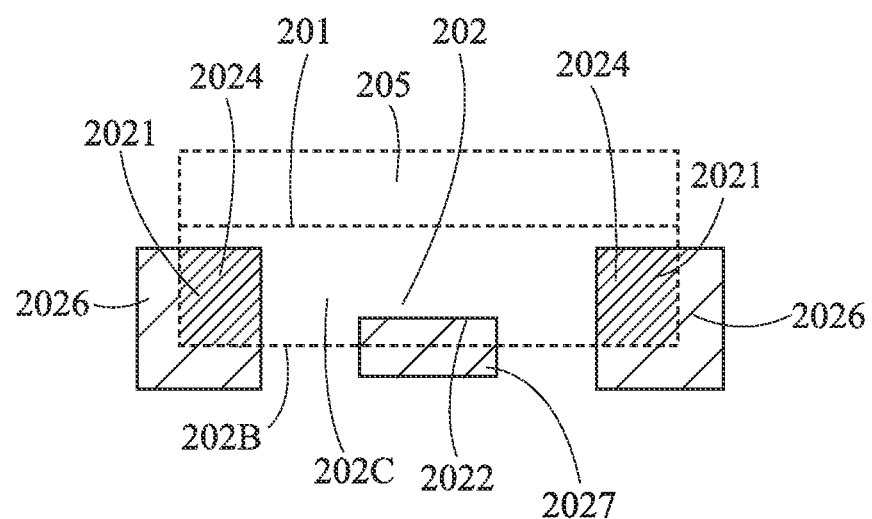
FIG. 6E is a schematic view illustrating the semiconductor package structure of FIG. 6B being disposed on a printed circuit board (PCB)

In this way, as shown in FIG. 6E, when the package structure 20A is disposed on the surface of a printed circuit board (PCB) (not shown, the lower surface 202 is towards the surface of the printed circuit board (PCB), and solder 2026 exists on the electrode region of the surface), the solder 2026 on the printed circuit board (PCB) may be received in the receiving portion 2021, so the solder 2026 will not be pressed by the substrate 202 and shifted to other places. Moreover, the solder 2026 may contact with the electrode 2024 in the receiving portion 2021 and be electrically connected with the electrode 2024. Therefore, through the design of the first solder receiving portion, the electrical contact area may be increased, the element bonding may be enhanced, and moreover, the flowing range (movement) of the solder may be further limited.

In addition to the first solder receiving portions 2021, the substrate 202 may further comprise a second solder receiving portion 2022 (which is called a receiving portion 2022 hereinafter, as shown in FIG. 6D), and the receiving portion 2022 is also disposed on the lower surface 202C and located between the receiving portions 2021. Accordingly, when the package structure 20A is disposed on the printed circuit board (PCB), another solder 2027 may be received in the receiving portion 2022. The solder 2027 may not need to be electrically connected with the substrate 202, but the solder 2027 fixed in the receiving portion 2022 may enhance the bonding force between he substrate 202 and the printed circuit board (PCB). If the bonding force between the substrate 202 and the printed circuit board (PCB) is already sufficient, the substrate 202 may not comprise the receiving portion 2022 or no solder 2027 is required on the printed circuit board (PCB).

Referring back to FIG. 5 and FIG. 6A, the package structure 20A preferably may further comprise a first encapsulant 204 and a second encapsulant 205 (which are called encapsulant 204 and encapsulant 205 hereinafter) to protect the semiconductor chip 203 or define a light emitting or light receiving range/angle of the semiconductor chip 203. Specifically, the encapsulant 204 covers the semiconductor chip 203, and the encapsulant 205 surrounds the encapsulant 204 and exposes a light-exiting surface 202D of the encapsulant 204. A flat surface is used as the light-exiting surface 202D as an example, but the light-exiting surface 202D may also be a curved surface. Additionally, the encapsulant 205 is a light reflective structure or a light absorbing structure, and the encapsulant 205 may be white. In this way, light can only enter into or exit from the encapsulant 204 via the light-exiting surface 202D. The package structure comprises a blue-green/UV light emitting or laser diode chip or fluorescent powder. The aforesaid fluorescent powder is disposed in the first encapsulant and is formed by a material having a high and stable light emitting characteristic, e.g., Garnet, YAG, TAG, LuAG, sulfate, nitrate, silicate, aluminate, potassium fluoride silicon (KSF), α-SiAlON, β SiAlON, quantum dot fluorescent powder or any combination of the aforesaid materials without being limited thereto, and the light emitting wavelength thereof is about 300 nm to 700 nm. The particle diameter of the aforesaid fluorescent powder is 1 to 25 μm.

Moreover, the external side surface of the encapsulant 205 may be level with or beyond the side surface of the substrate 201 so that the light-exiting surface 202D may be relatively large or long. The length-width ratio of the light-exiting surface 202D may be 15~17: 0.15~0.2. As shown in FIG. 6C, the thickness of the package structure in the vertical direction is smaller than the width of the substrate in the horizontal direction. The thickness of the package structure in the vertical direction may be not greater than 0.3 mm.

Figure 7A:
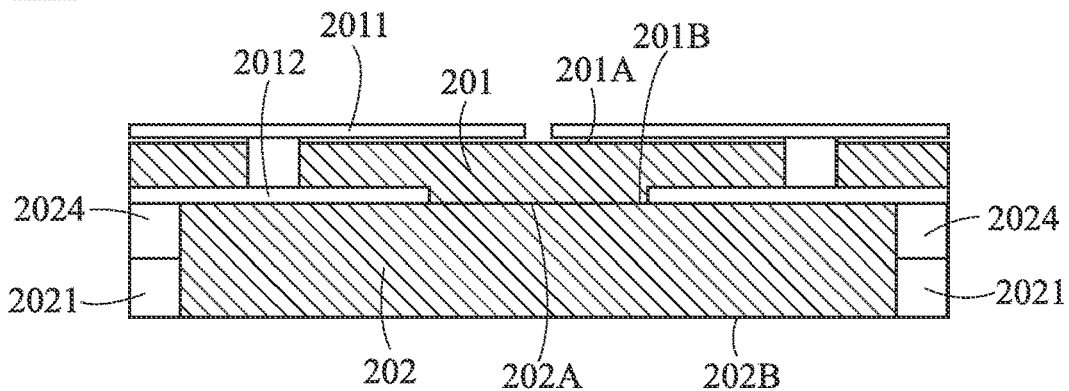
FIG. 7A to FIG. 7G are schematic views of manufacturing the semiconductor package structure according to the second preferred embodiment of the present invention.
Figure 7B:
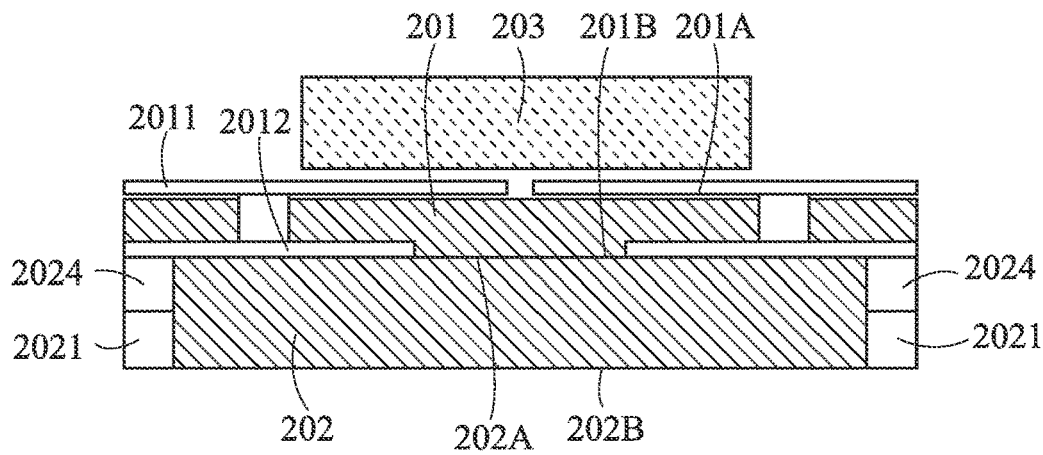
Figure 7C:
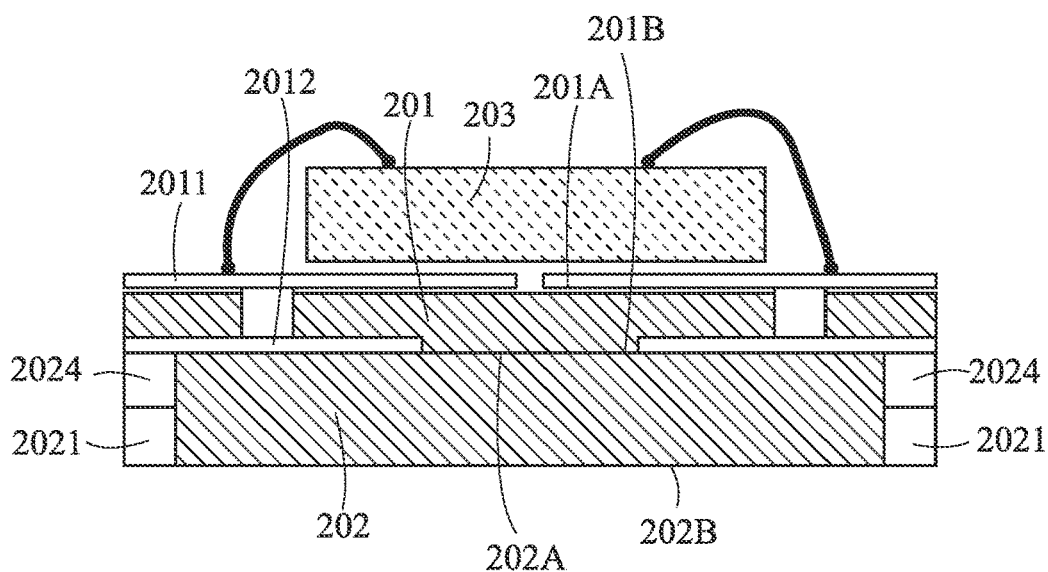

Next referring to FIG. 7A to FIG. 7G, a method of manufacturing the package structure 20A will be described sequentially. As shown in FIG. 7A, first a substrate or a multilayer substrate is provided (i.e., the substrate 201 and the substrate 202 are stacked and electrically connected with each other). Next, as shown in FIG. 7B and FIG. 7C, the semiconductor chip 203 is disposed on the front surface 201A of the substrate 201, and the semiconductor chip 203 is electrically connected to the conductive pattern layer 2011 of the substrate 201 via a -bonding wire. In this way, the semiconductor chip 203 is electrically connected to the electrode 2024 via the conductive pattern layer 2011.

Figure 7D:
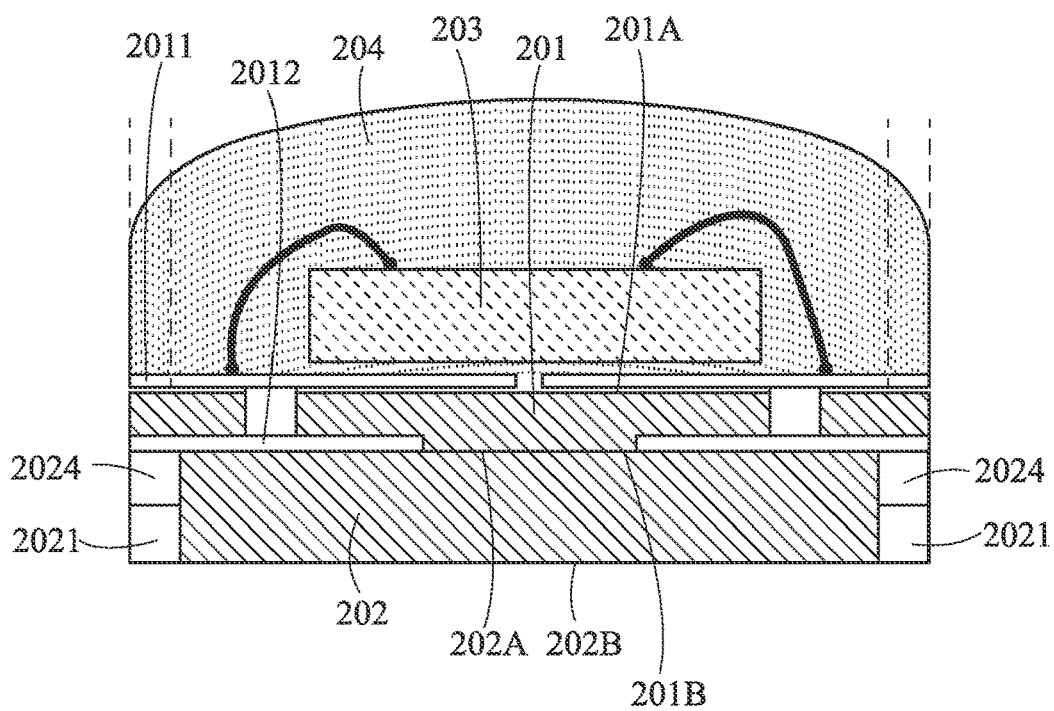
Figure 7E:
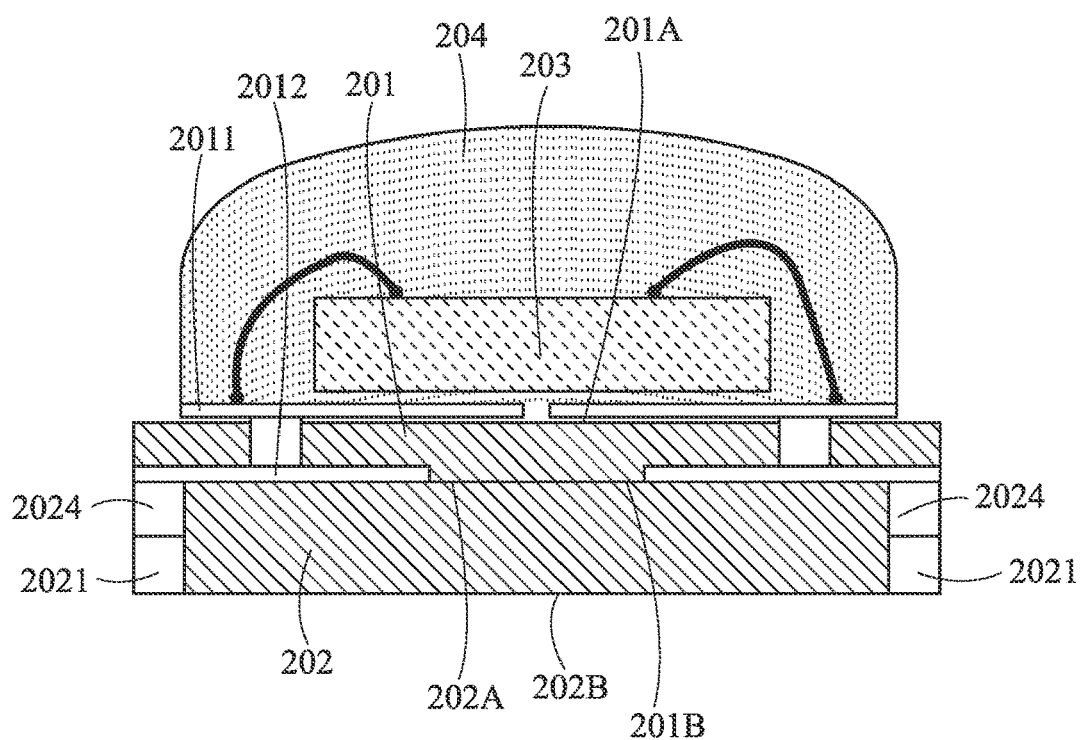

Then, as shown in FIG. 7D and FIG. 7E, a raw material of the encapsulant 204 (e.g., silicone to be described later) is coated onto the substrate 201 and covers the conductive pattern layer 2011, the semiconductor chip 203 and the bonding wire. After the encapsulant 204 is cured, the peripheral part of the encapsulant 204 (i.e., a part between two dotted lines in the figure) is removed by cutting or the like, and the peripheral part of the conductive pattern layer 2011 is also removed together. It shall be appreciated that, although the peripheral part of the conductive pattern layer 2011 is removed, the signal transmission path between the semiconductor chip 203, and the conductive pattern layer 2011 to the electrode 2024 will not be interrupted. Additionally, if the conductive pattern layer 2011 is not designed initially to extend to the side surface of the substrate 201 (i.e., without the aforesaid peripheral part), the encapsulant 204 will be partially removed and the conductive pattern layer 2011 will not be partially removed together.

Figure 7F:
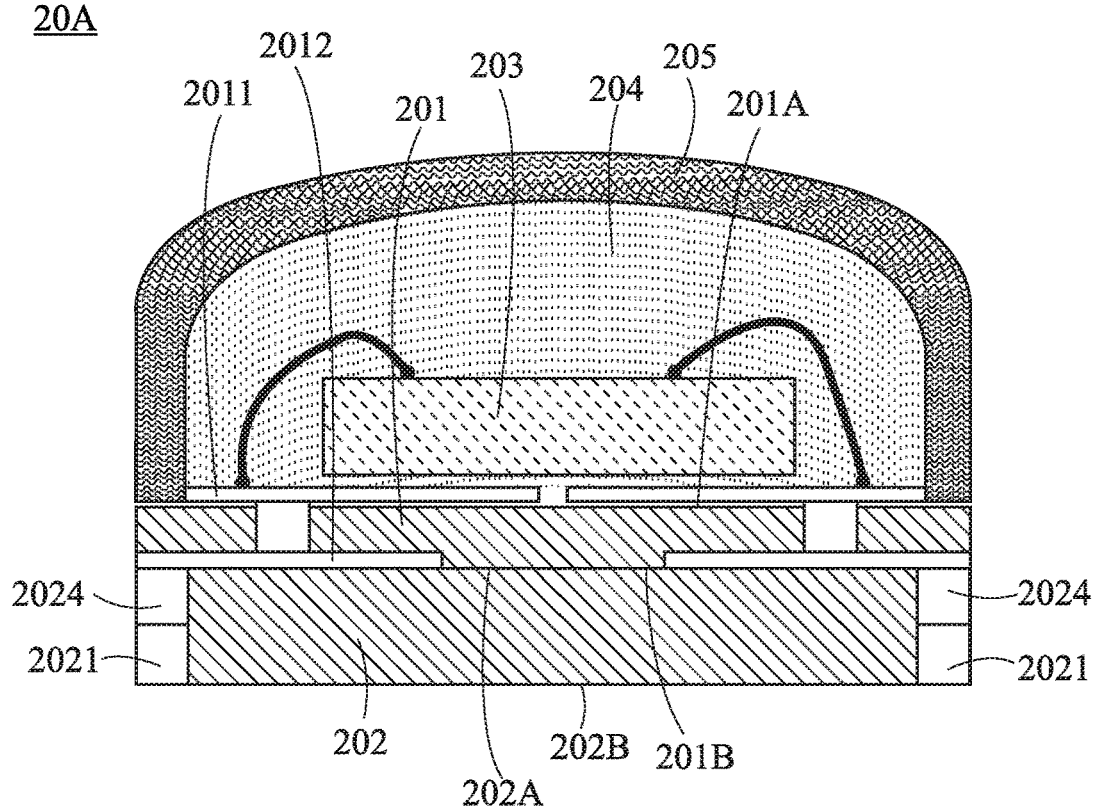
Figure 7G:
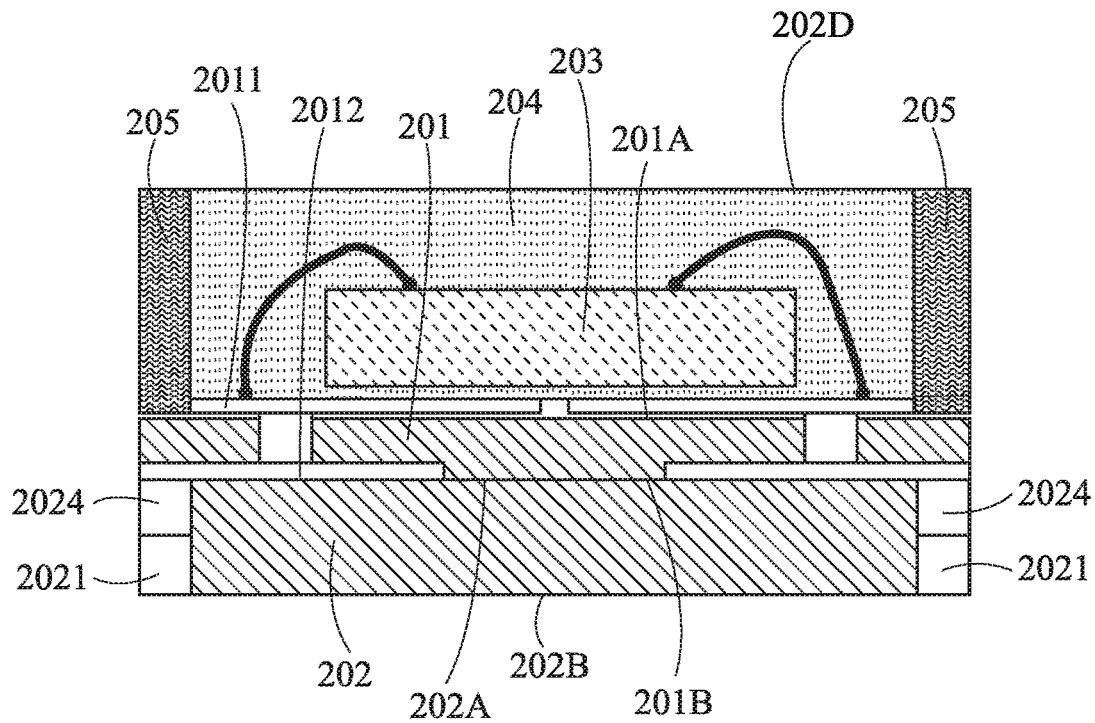

Finally, as shown in FIG. 7F and FIG. 7G, the second encapsulant 205 is coated onto the substrate 201 and covers the encapsulant 204 and a part of the front surface 201A. After the encapsulant 205 is cured, the two encapsulants 204 and 205 are partially removed via polishing or shaving or the like so that the encapsulant 204 is surrounded by the encapsulant 205 and has a light-exiting surface 202D of a desired shape. The conductive pattern layer 2011 is also surrounded by the encapsulant 205 instead of being covered by the encapsulant. In this way, the aforesaid package structure 20A can be manufactured after a cutting process.

Figure 8A:
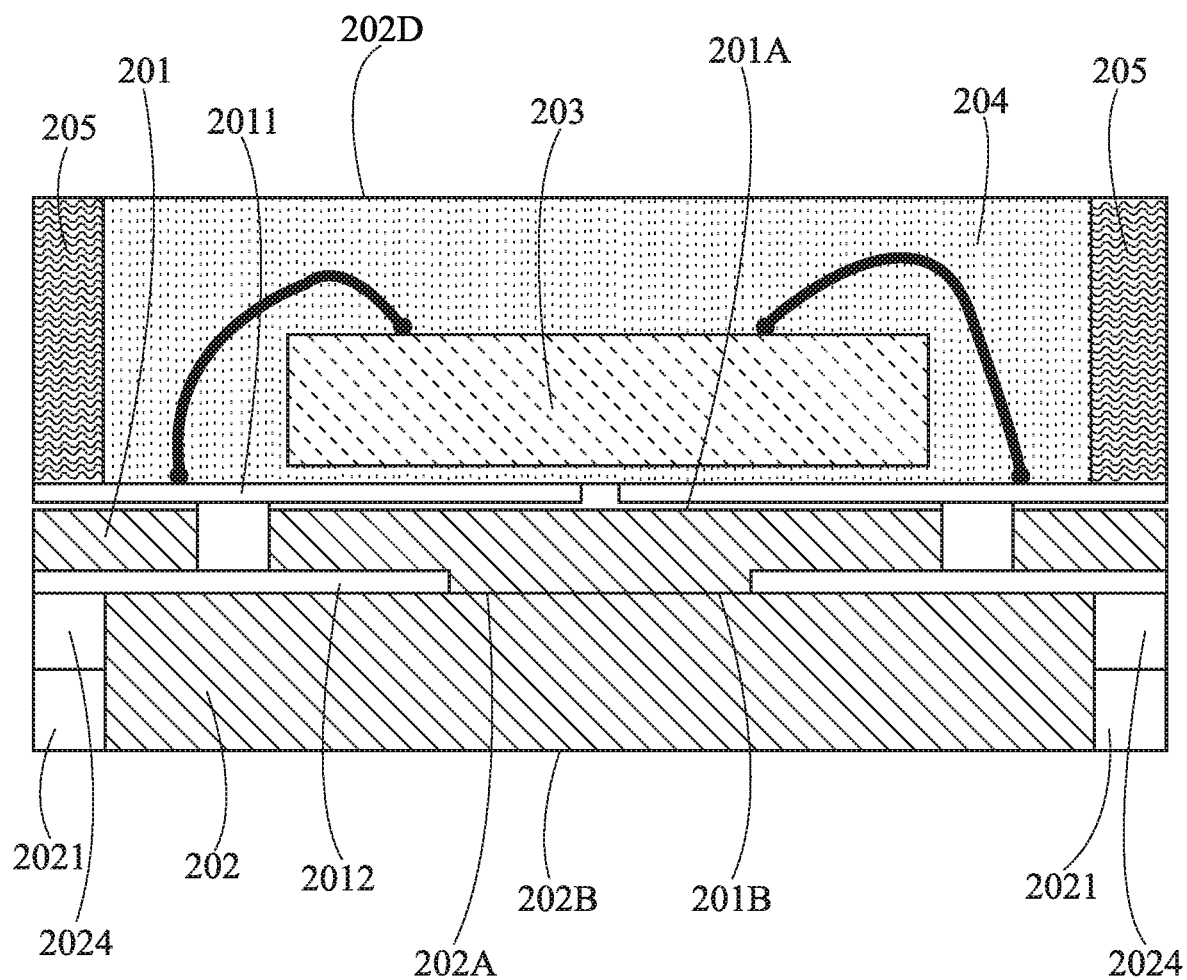
FIG. 8A and FIG. 8B are other cross-sectional views of the semiconductor package structure according to the second preferred embodiment of the present invention.
Figure 8B:
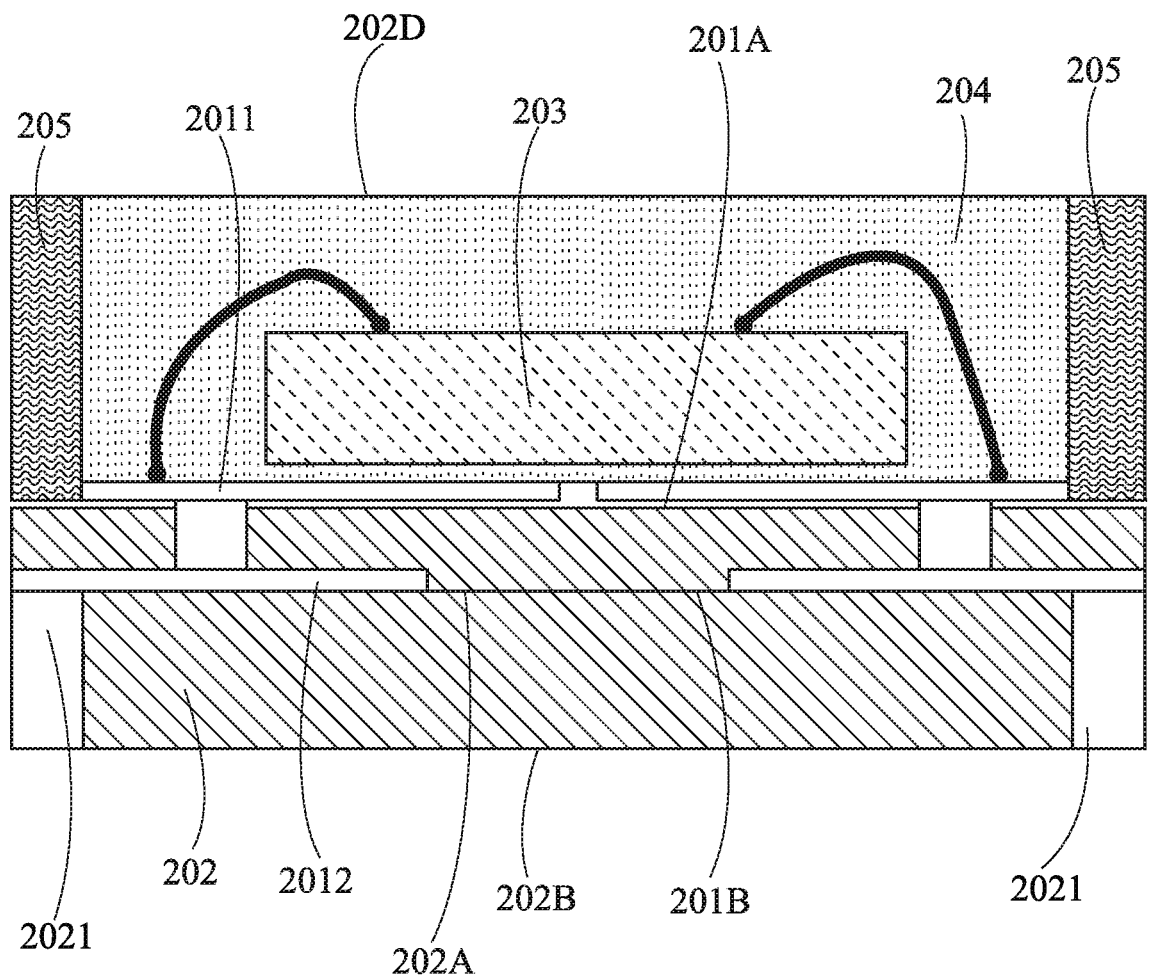

Referring to FIG. 8A and FIG. 8B, other implementations of the package structure 20A will be described next. As shown in FIG. 8A, the peripheral part of the conductive pattern layer 2011 of the package structure 20A is not removed, so the encapsulant 205 will partially cover the conductive pattern layer 2011. As shown in FIG. 8B, the receiving portion 2021 of the substrate 202 is a groove penetrating through the front surface 202A and the rear surface 202B, and the conductive pattern layer 2012 on the front surface 202A is exposed in the receiving portion 2021. In this implementation, the substrate 202 may not require the electrode 2024 with the conductive pattern layer 2012 serving as an alternative. Thus, when the solder 2026 is received in the receiving portion 2021, the solder 2026 may directly contact with the conductive pattern layer 2012. Additionally, because the receiving portion 2021 is relatively large and can receive more solder 2026, the solder 2026 on the printed circuit board (PCB) is less likely to be shifted.

Accordingly, the package structure proposed according to the second preferred embodiment of the present invention may prevent or improve the shift of the solder on the printed circuit board (PCB), so a plurality of package structures may be arranged on the printed circuit board (PCB) more densely without being short-circuited due to the shift of the solder. Additionally, two notches of the package structure proposed according to the first preferred embodiment of the present invention may also function as solder receiving portions.

Silicone having high thixotropy that is proposed according to a third preferred embodiment of the present invention will be described hereinafter. The silicone may for example be applied as the encapsulant 104 and 204 of the aforesaid semiconductor package structure 10A and 20A (as shown in FIG. 1 and FIG. 5) so that the encapsulant is less likely to be deformed, e.g., collapse, during the molding process (curing after being baked at a high temperature, as shown in FIG. 7D).

Specifically, in order to make the encapsulant have relatively high thixotropy, the encapsulant may be silicone, and the silicone comprises hydrotropic silica, that is, hydrotropic silica is added into the silicone. The hydrotropic silica is silica powder that has not been subjected to surface treatment and thus is hydrotropic. Moreover, the silica powder comprises OH groups (distributed on the surface of the powder), so more hydrogen bonds can be formed in silicone.

In this way, a meshed microstructure formed by more hydrogen bonds may exist in the silicone, and the network structure can support the fluid part of the silicone so that the silicone on the whole has better thixotropy and is less likely to be deformed. Additionally, the encapsulant can also have relatively large hardness after being cured, so the encapsulant will not be deformed when the encapsulant is under a force used for the molding of another encapsulant.

Preferably, the silicone may be phenyl-based silicone, and the hydrotropic silica may be hydrotropic fumed silica. Such configuration not only enables the silicone to have relatively high thixotropy and hardness, but also enables the silicone to have a refractive index above 1.5 due to the existence of phenyl. In this way, the refractive index of the encapsulant may be closer to the refractive index of the semiconductor chip to improve the light extraction efficiency. For the hydrotropic fumed silica, the surface thereof is not processed, so there are more silanol groups and this facilitates the formation of hydrogen bonds. Moreover, the specific surface area of the hydrotropic fumed silica is 50 m$^2$/g to 300 m$^2$/g (square meter/gram), and preferably is 150 m$^2$/g to 220 m$^2$/g, which increases the formation of hydrogen bonds.

When silicone is the phenyl-based silicone, the silicone may have better humidity resistance and sulfur resistance so that the humidity and sulfur in the environment will not easily enter into or penetrate through the silicone and the fluorescent material in the encapsulant is less likely to be influenced by the humidity, and metal materials such as the electrode of the semiconductor chip or the conductive pattern layer of the substrate is less likely to be sulfurized.

On the other hand, to maintain the high thixotropy of the silicone for a longer period, the silicone further comprises an additive that can form a hydrogen bond with the silanol group. Specifically, the additive enables more hydrogen bonds to be generated in the silicone, thereby improving the thixotropy. The additive may be selected from additives that have good compatibility with the silicone, are less likely to migrate and have heat resistance and yellowing resistance, and the additives may for example include but not limited to at least one of function groups of epoxy, methacryloxy and isocyanato, or a scattered oligomers of the aforesaid groups. The weight percentage of the additive in the silicone may be 0.1% to 3% and preferably may be 0.7% to 1.2%.

The epoxy group may include but not limited to: 2-(3,4 epoxycyclohexyl)-ethyltrimethoxysilane

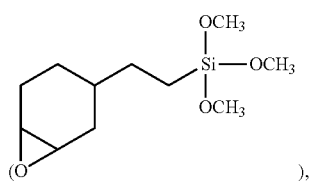

3-glycidoxypropyl trimethoxysilane

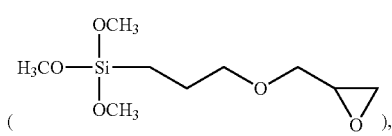 [SMILES: CO[Si](CCCOCC1CO1)(OC)OC]

3-glycidoxypropyl methyldiethoxysilane

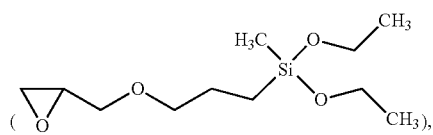 [SMILES: CCO[Si](C)(CCCOCC1CO1)OCC]

or 3-glycidoxypropyl triethoxysilane

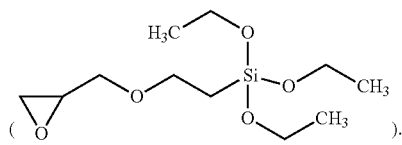 [SMILES: CCO[Si](CCOCC1CO1)(OCC)OCC]

The methacryloxy group may include but not limited to: 3-methacryloxypropyl methyldimethoxysilane

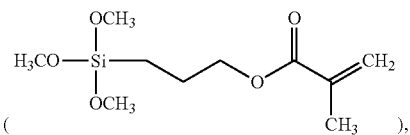 [SMILES: C=C(C)C(=O)OCCC[Si](OC)(OC)OC]

3-methacryloxypropyl trimethoxysilane

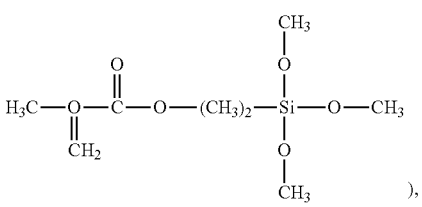

3-methacryloxypropyl methyldiethoxysilane

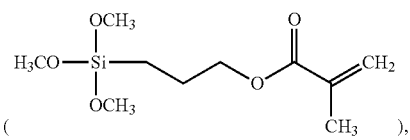

or 3-methacryloxypropyl triethoxysilan

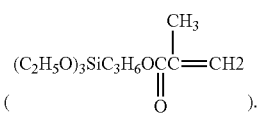

The isocyanato group may include but not limited to: 3-isocyanatopropyl triethoxysilan (($C_2H_5O)_3SiC_3H_6N$=C=O), or 3-isocyanatopropyl trimethoxy (($CH_3O)_3SiC_3H_6N$=C=O).

According to the above descriptions, the semiconductor package structure proposed by the present invention can reduce the overall thickness of the electronic product and can improve or prevent the shift of the solder on the printed circuit board (PCB); and moreover, the encapsulant proposed by the present invention may have better thixotropy, hardness, humidity resistance and sulfur resistance and/or refractive index, so it is suitable to be used in the semiconductor package structure.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor package structure, comprising:
    a first substrate, comprising a base portion, a first protrusion and a second protrusion, the base portion comprising a first front surface, a first side surface and a second side surface, the first protrusion and the second protrusion respectively extending from the first side surface and the second side surface, the first protrusion and the second protrusion respectively comprising a first connection surface and a second connection surface, and the first connection surface and the second connection surface respectively connecting to the first side surface and the second side surface;
    a second substrate, comprising a second front surface, the first substrate being disposed on a portion of the second front surface, wherein the second substrate further comprises a rear surface and a conductive pattern layer, the rear surface is opposite to the second front surface, and the conductive pattern layer is disposed on the rear surface and the second front surface; and
    a semiconductor chip, being disposed on the first front surface of the base portion.

2. The semiconductor package structure of claim 1, wherein the first substrate further comprises another conductive pattern layer, the another conductive pattern layer is disposed on the first front surface, the first side surface and the second side surface of the base portion, wherein the another conductive pattern layer is electrically connected with the semiconductor chip.

3. The semiconductor package structure of claim 1, wherein the first substrate further comprises another conductive pattern layer, the another conductive pattern layer is disposed on the first front surface of the base portion the first connection surface of the first protrusion and the second connection surface of the first protrusion and the second protrusion, wherein the another conductive pattern layer is electrically connected with the semiconductor chip.

4. The semiconductor package structure of claim 1, wherein a first notch and a second notch are defined between the first substrate and the second substrate, the first notch is defined between the second front surface, the first side surface and the first connection surface, and the second notch is defined between the second front surface, the second side surface and the second connection surface.

5. An electronic device, comprising:
    a semiconductor package structure which includes:
        a first substrate, comprising a base portion, a first protrusion and a second protrusion, the base portion comprising a first front surface, a first side surface and a second side surface, the first protrusion and the second protrusion respectively extending from the first side surface and the second side surface, the first protrusion and the second protrusion respectively comprising a first connection surface and a second connection surface, and the first connection surface and the second connection surface respectively connecting to the first side surface and the second side surface;
        a second substrate, comprising a second front surface, the first substrate being disposed on a portion of the second front surface; and
        a semiconductor chip, being disposed on the first front surface of the base portion; and
    a printed circuit board (PCB), comprising an PCB cutout, the first substrate and the second substrate of the semiconductor package structure being partially located within the PCB cutout, and the semiconductor package structure being electrically connected with the printed circuit board.

6. The electronic device of claim 5, wherein the printed circuit board further comprises a first supporting portion and a second supporting portion, the first supporting portion and the second supporting portion are separated by the PCB cutout; the first protrusion and the second protrusion are respectively located on the first supporting portion and the second supporting portion.

7. The electronic device of claim 5, wherein the semiconductor chip is also located within the PCB cutout.

8. The electronic device of claim 5, wherein the first substrate further comprises a conductive pattern layer, the conductive pattern layer is disposed on the first front surface, the first side surface and the second side surface of the base portion, wherein the conductive pattern layer is electrically connected with the semiconductor chip.

9. The electronic device of claim 8, wherein the second substrate further comprises a rear surface and another conductive pattern layer, the rear surface is opposite to the second front surface, and the another conductive pattern layer is disposed on the rear surface and the second front surface.

10. The electronic device of claim 9, wherein a first notch and a second notch are defined between the first substrate and the second substrate, the first notch is defined between the second front surface, the first side surface and the first connection surface, and the second notch is defined between the second front surface, the second side surface and the second connection surface.

11. The electronic device of claim 5, wherein the first substrate further comprises a conductive pattern layer, the conductive pattern layer is disposed on the first front surface of the base portion, the first connection surface of the first protrusion and the second connection surface of the second protrusion, wherein the conductive pattern layer is electrically connected with the semiconductor chip.

12. The electronic device of claim 11, wherein the second substrate further comprises a rear surface and another conductive pattern layer, the rear surface is opposite to the second front surface, and the another conductive pattern layer is disposed on the rear surface and the second front surface.

13. The electronic device of claim 12, wherein a first notch and a second notch are defined between the first substrate and the second substrate, the first notch is defined between the second front surface, the first side surface and the first connection surface, and the second notch is defined between the second front surface, the second side surface and the second connection surface.

14. The electronic device of claim 5, wherein a first notch and a second notch are defined between the first substrate and the second substrate, the first notch is defined between the second front surface, the first side surface and the first connection surface, and the second notch is defined between the second front surface, the second side surface and the second connection surface.

15. The electronic device of claim 5, wherein the second substrate further comprises a rear surface and a conductive pattern layer, the rear surface is opposite to the second front surface, and the conductive pattern layer is disposed on the rear surface and the second front surface.

16. The electronic device of claim 6, wherein a first notch and a second notch are defined between the first substrate and the second substrate, the first notch is defined between the second front surface, the first side surface and the first connection surface, and the second notch is defined between the second front surface, the second side surface and the second connection surface.

17. The electronic device of claim 6, wherein the second substrate further comprises a rear surface and a conductive pattern layer, the rear surface is opposite to the second front surface, and the conductive pattern layer is disposed on the rear surface and the second front surface.

18. The semiconductor package structure of claim 2, wherein a first notch and a second notch are defined between the first substrate and the second substrate, the first notch is defined between the second front surface, the first side surface and the first connection surface, and the second notch is defined between the second front surface, the second side surface and the second connection surface.

19. The semiconductor package structure of claim 3, wherein a first notch and a second notch are defined between the first substrate and the second substrate, the first notch is defined between the second front surface, the first side surface and the first connection surface, and the second notch is defined between the second front surface, the second side surface and the second connection surface.

* * * * *